US012622200B2

(12) United States Patent (10) Patent No.: US 12,622,200 B2
Umezaki et al. (45) Date of Patent: May 5, 2026

(54) SUBSTRATE PROCESSING APPARATUS AND SUBSTRATE PROCESSING METHOD

(71) Applicant: Tokyo Electron Limited, Tokyo (JP)

(72) Inventors: Shota Umezaki, Koshi (JP); Takahiro Hayashida, Koshi (JP); Mikio Nakashima, Koshi (JP); Takafumi Yasunaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 108 days.

(21) Appl. No.: 18/412,768

(22) Filed: Jan. 15, 2024

(65) Prior Publication Data

US 2024/0242977 A1 Jul. 18, 2024

(30) Foreign Application Priority Data

Jan. 17, 2023 (JP) ................................. 2023-004940

(51) Int. Cl.
H01L 21/67 (2006.01)
(52) U.S. Cl.
CPC .. H01L 21/67023 (2013.01); H01L 21/67167 (2013.01); H01L 21/67196 (2013.01)

(58) Field of Classification Search
CPC ......... H01L 21/67023; H01L 21/67167; H01L 21/67196
USPC ......................................................... 134/201
See application file for complete search history.

(56) References Cited

U.S. PATENT DOCUMENTS

2022/0319876 A1* 10/2022 Hayashi ........... H01L 21/67178

FOREIGN PATENT DOCUMENTS

JP 2022-030851 A 2/2022

* cited by examiner

*Primary Examiner* — Tinsae B Ayalew
(74) *Attorney, Agent, or Firm* — Chrisman Gallo Tochtrop LLC

(57) ABSTRACT

A substrate processing apparatus includes a unit block including multiple liquid film forming devices each configured to form a liquid film on a top surface of a substrate, and a drying device configured to replace the liquid film with a supercritical fluid to dry the substrate; and a transfer block provided between the multiple liquid film forming devices and the drying device. The transfer block includes a transfer device configured to transfer the substrate between the multiple liquid film forming devices and the drying device, and a length of a transfer path of the substrate is equal between each of the multiple liquid film forming devices and the drying device.

12 Claims, 34 Drawing Sheets

FIG. 23A
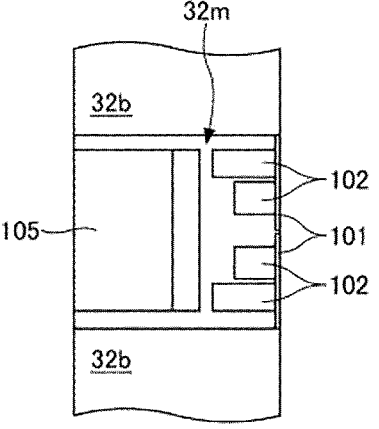
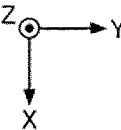
FIG. 23B
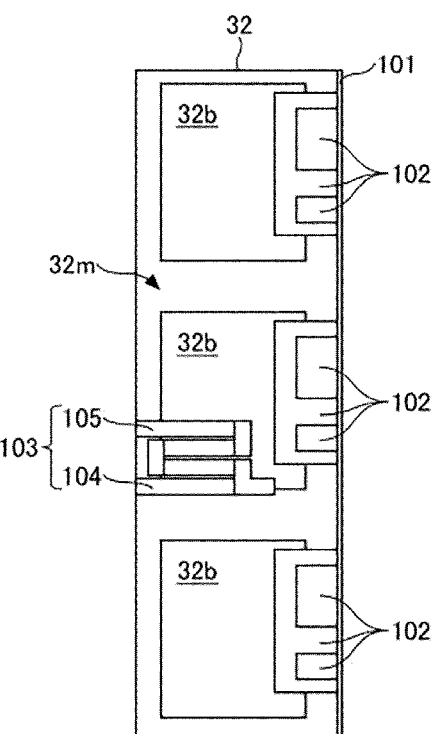
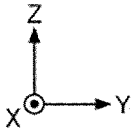

*FIG. 33A*          *FIG. 33B*
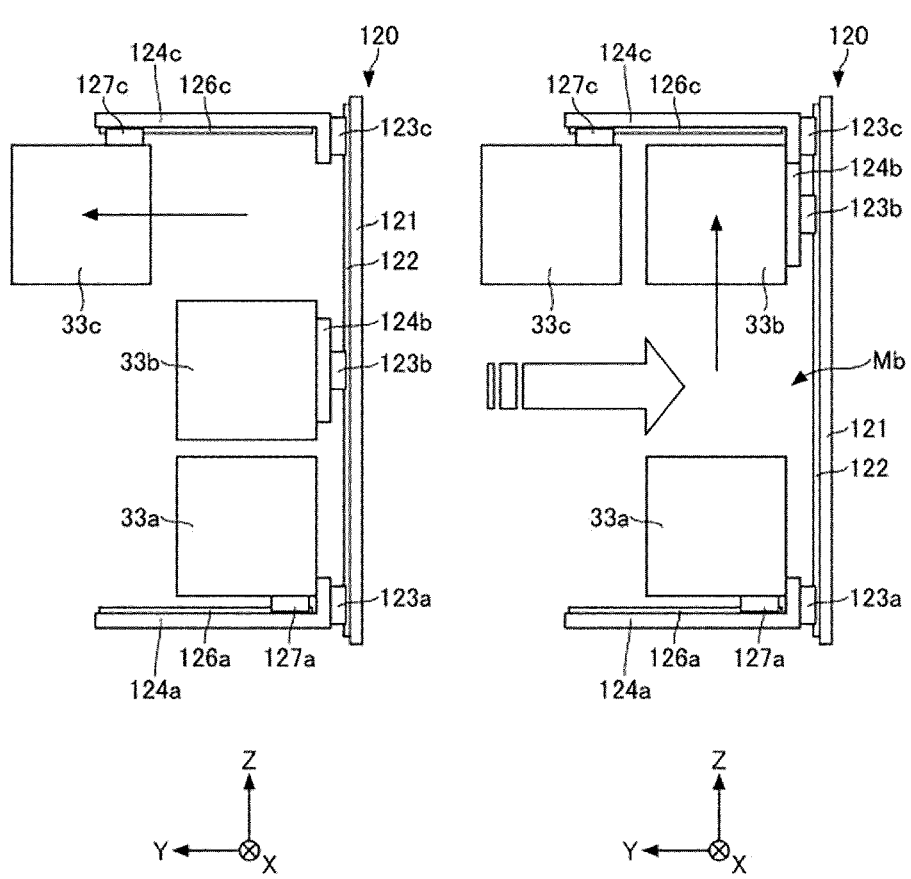

SUBSTRATE PROCESSING APPARATUS AND SUBSTRATE PROCESSING METHOD

CROSS-REFERENCE TO RELATED APPLICATION

This application claims the benefit of Japanese Patent Application No. 2023-004940 filed on Jan. 17, 2023, the entire disclosures of which are incorporated herein by reference.

TECHNICAL FIELD

The various aspects and embodiments described herein pertain generally to a substrate processing apparatus and a substrate processing method.

BACKGROUND

There is known a technique of drying a substrate by using a supercritical fluid. Patent Document 1 discloses an apparatus having multiple sets of liquid film forming units and drying units. The drying unit dries the substrate by replacing the liquid film formed on a top surface of the substrate in the liquid film forming unit with the supercritical fluid.

Patent Document 1: Japanese Patent Laid-open Publication No. 2022-030851

SUMMARY

In one exemplary embodiment, a substrate processing apparatus includes a unit block including multiple liquid film forming devices each configured to form a liquid film on a top surface of a substrate, and a drying device configured to replace the liquid film with a supercritical fluid to dry the substrate; and a transfer block provided between the multiple liquid film forming devices and the drying device. The transfer block includes a transfer device configured to transfer the substrate between the multiple liquid film forming devices and the drying device, and a length of a transfer path of the substrate is equal between each of the multiple liquid film forming devices and the drying device.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3 is a side view of the substrate processing apparatus according to the exemplary embodiment;

Figure 4:
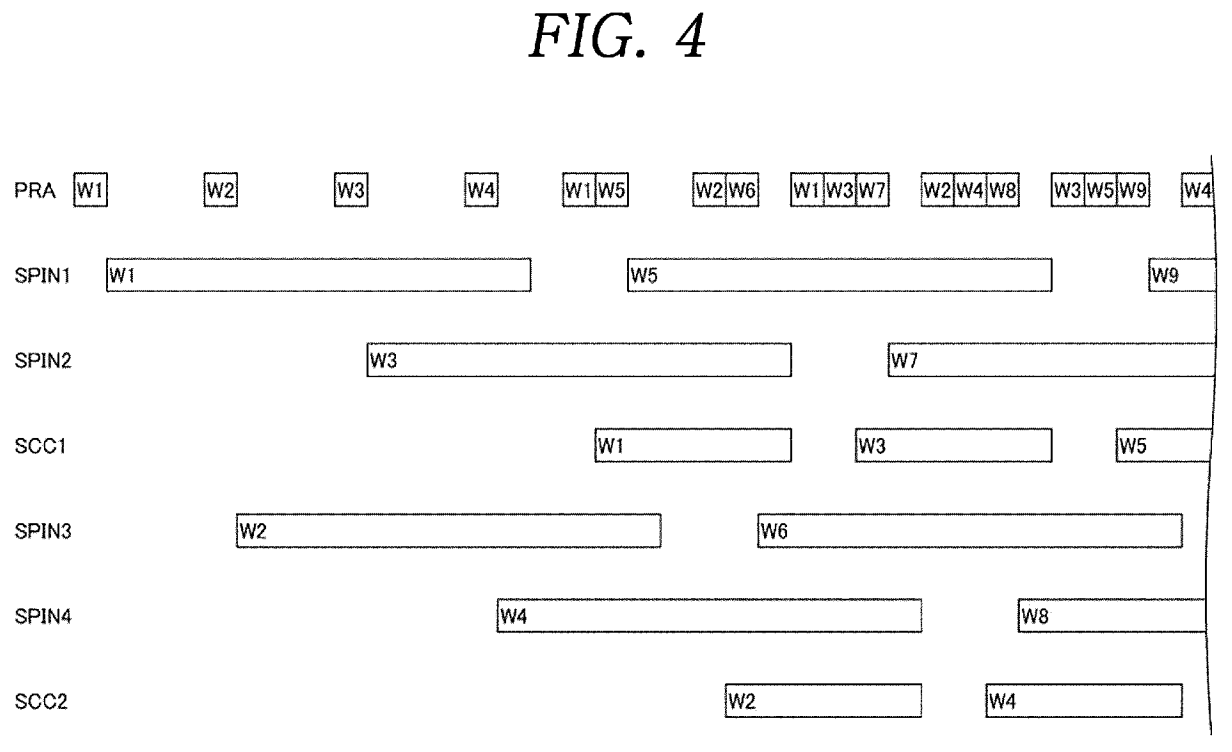

FIG. 4 is a timing chart showing a substrate processing method according to the exemplary embodiment;

FIG. 23A and FIG. 23B are diagrams showing an intermediate area when a device is in operation;

FIG. 27 is a plan view of a substrate processing apparatus according to a second modification example of the exemplary embodiment;

FIG. 32A to FIG. 32C are side views illustrating movements of electrical equipment boxes during the maintenance of the lower level;

FIG. 33A and FIG. 33B are side views illustrating movements of the electrical equipment boxes during the maintenance of the intermediate level; and FIG. 34A to FIG. 34C are side views illustrating movements of the electrical equipment boxes during the maintenance of the upper level.

DETAILED DESCRIPTION

Figure 1:
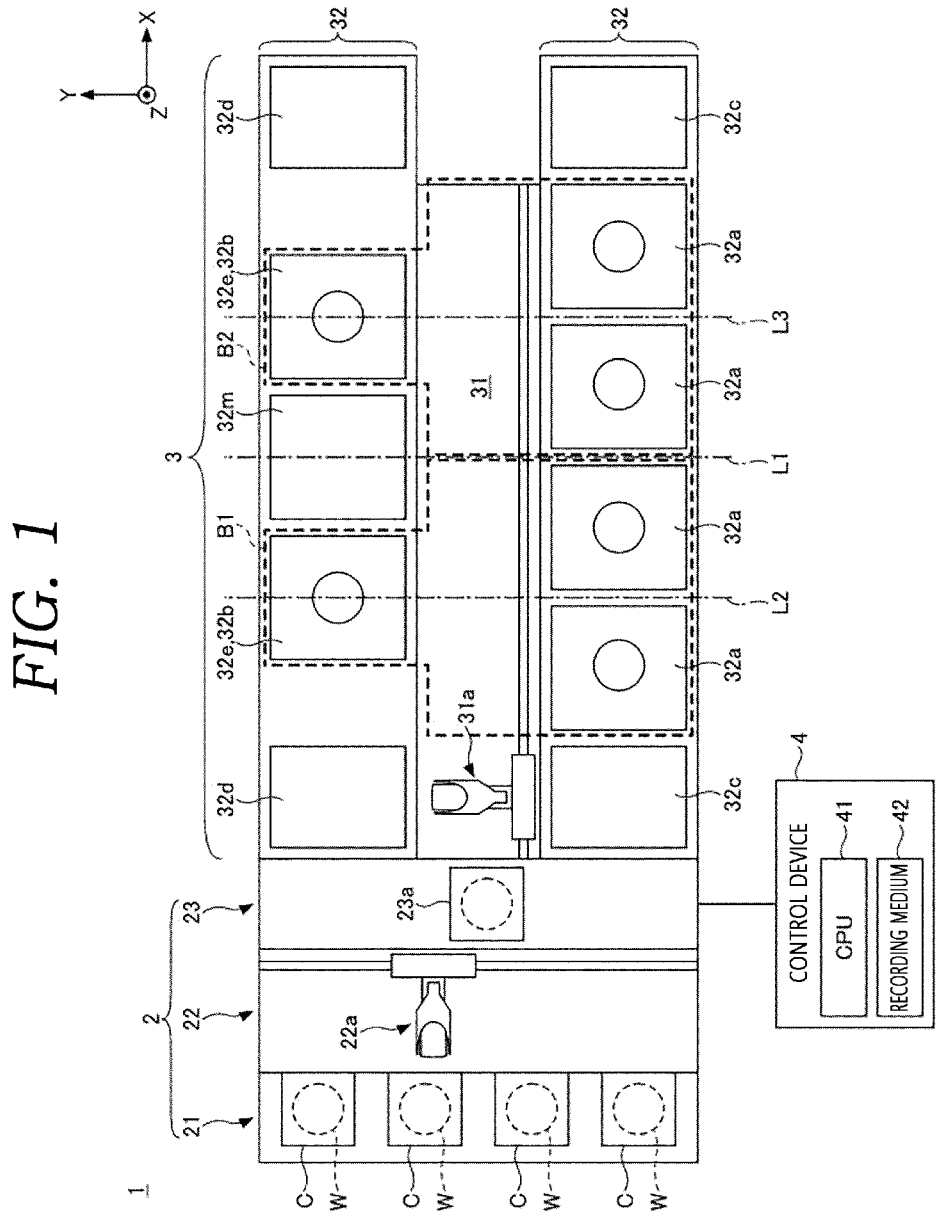
FIG. 1 is a plan view of a substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, non-limiting exemplary embodiments of the present disclosure will be described with reference to the accompanying drawings. In the various drawings, same or corresponding parts will be assigned same or corresponding reference numerals, and redundant description thereof will be omitted. In the present specification, the X-axis direction, the Y-axis direction, and the Z-axis direction are orthogonal to each other. The X-axis direction and Y-axis direction are horizontal directions, whereas the Z-axis direction is a vertical direction.

Substrate Processing Apparatus

Figure 2:
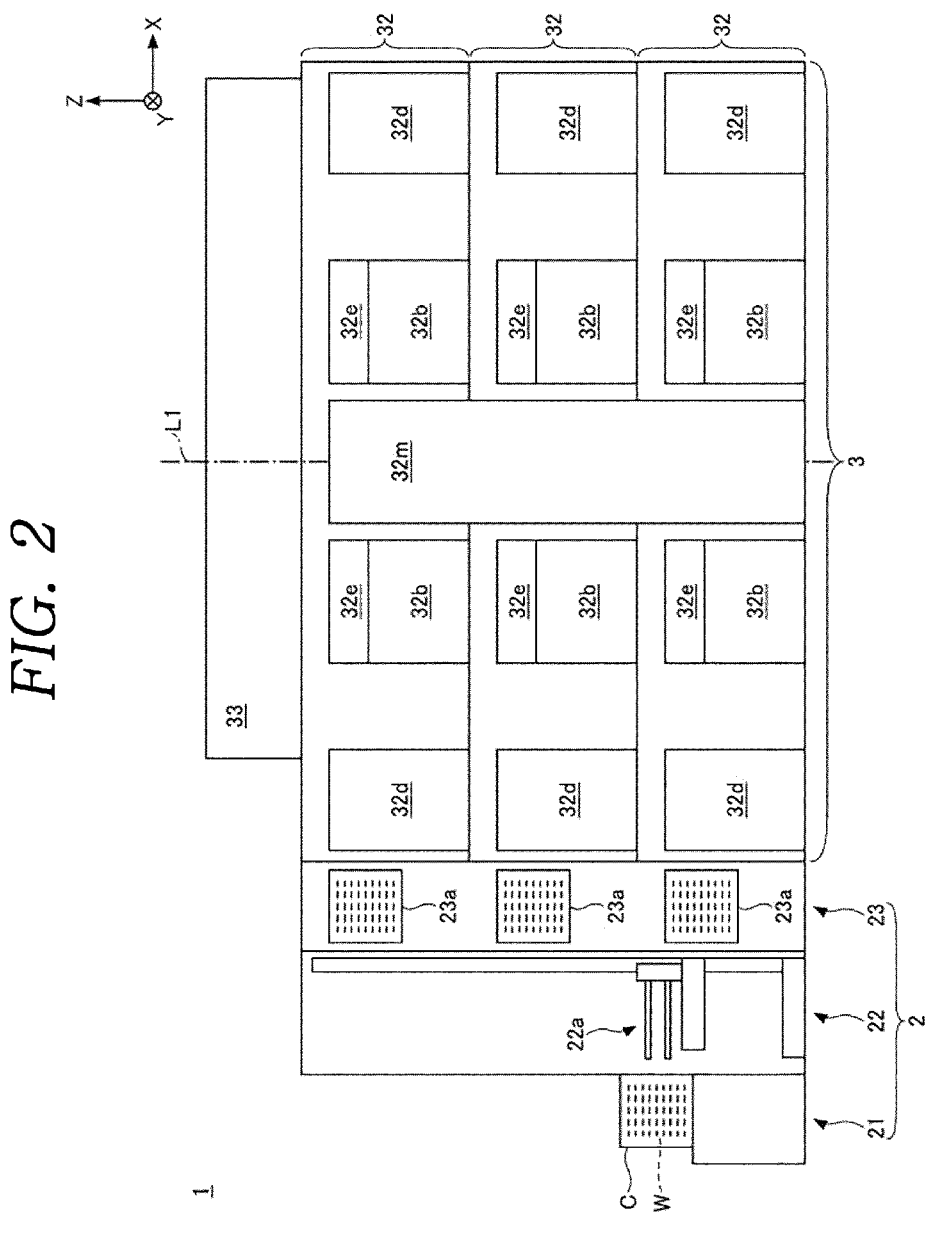
FIG. 2 is a front view of the substrate processing apparatus according to the exemplary embodiment.
Figure 3:
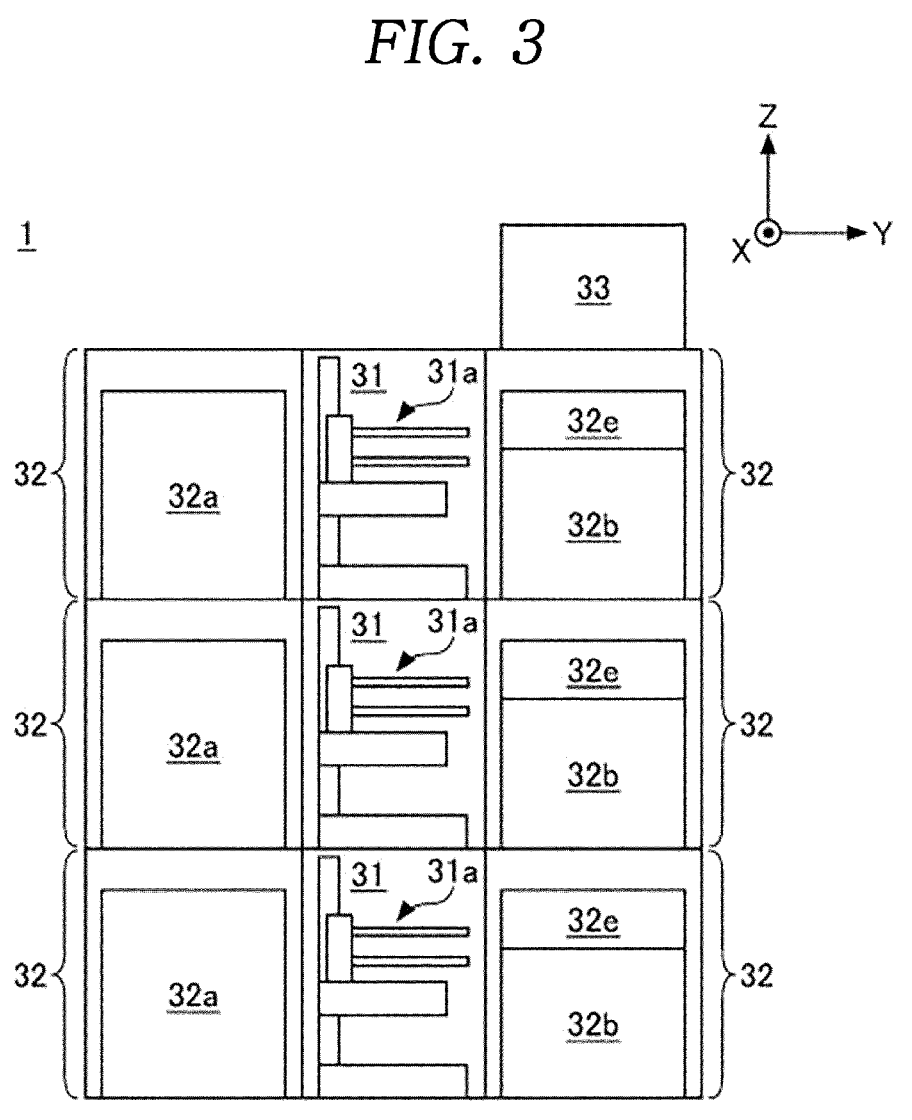

Referring to FIG. 1 to FIG. 3, a substrate processing apparatus 1 according to an exemplary embodiment will be explained. FIG. 1 is a plan view of the substrate processing apparatus 1 according to the exemplary embodiment. FIG. 2 is a front view of the substrate processing apparatus 1 according to the exemplary embodiment. FIG. 3 is a side view of the substrate processing apparatus according to the exemplary embodiment.

The substrate processing apparatus 1 is equipped with a carry-in/out station 2 and a processing station 3. The carry-in/out station 2 and the processing station 3 are provided adjacent to each other in the X-axis direction.

The carry-in/out station 2 is equipped with a placing table 21, a transfer section 22, and a delivery section 23. A plurality of carriers C is placed on the placing table 21. Each of these carriers C accommodates therein a multiple number of substrates W horizontally while maintaining a regular distance between the substrates W in a vertical direction.

The substrate W may include a semiconductor substrate such as a silicon wafer or a compound semiconductor wafer, or a glass substrate. The substrate W may further include a device such as an electronic circuit formed on a surface of the semiconductor substrate or the glass substrate. The substrate W may have an irregularity pattern on the surface thereof.

The transfer section 22 is provided adjacent to the placing table 21. A first transfer device 22a is disposed within the transfer section 22. The first transfer device 22a is configured to transfer the substrate W within the transfer section 22 and transfer the substrate W to/from a plurality of apparatuses disposed next to the transfer section 22.

The first transfer device 22a includes a first transfer arm configured to hold the substrate W. The first transfer arm is movable in horizontal directions (both the X-axis direction and the Y-axis direction) and the vertical direction, and is pivotable around a vertical axis. The number of the first transfer arm may be one or more.

The delivery section 23 is provided adjacent to the transfer section 22. The delivery section 23 includes a transition device 23a configured to accommodate therein the substrate W temporarily. As illustrated in FIG. 2, a plurality of transition devices 23a may be stacked in the vertical direction. Here, the layout and the number of the transition devices 23a are not particularly limited.

The processing station 3 is equipped with a transfer block 31, a plurality of processing blocks 32, and an electrical equipment block 33.

The transfer block 31 is provided adjacent to the delivery section 23. The transfer block 31 is of a rectangular parallelepiped shape. A second transfer device 31a is disposed within the transfer block 31.

The second transfer device 31a is configured to transfer the substrate W between a plurality of apparatuses disposed next to the transfer block 31. The second transfer device 31a includes a second transfer arm configured to hold the substrate W. The second transfer arm is movable in the horizontal directions (both the X-axis direction and the Y-axis direction) and the vertical direction, and is pivotable around a vertical axis. The number of the second transfer arm may be one or more.

The plurality of processing blocks 32 are arranged on both sides of the transfer block 31 in the Y-axis direction. Each processing block 32 is disposed adjacent to the transfer block 31. As shown in FIG. 2, the plurality of processing blocks 32 are stacked on top of each other in the vertical direction. In this case, the footprint of the processing blocks 32 can be reduced. However, the layout and the number of the processing blocks 32 are not particularly limited. When the plurality of processing blocks 32 are stacked in multiple levels in the vertical direction, a plurality of transfer blocks 31 may also be stacked in multiple levels in the vertical direction as shown in FIG. 3. The number of the levels of the transfer blocks 31 and the number of the levels of the processing blocks 32 are equal. Multiple substrates W can be transferred simultaneously at different heights, so that the number of the substrates W processed per unit time can be increased. However, the layout and the number of the transfer blocks 31 are not particularly limited.

The plurality of processing blocks 32 include liquid film forming devices 32a, drying devices 32b, supplying devices 32c and 32d, inspecting devices 32e, and an intermediate area 32m.

Four liquid film forming devices 32a are provided in the processing block 32 located on the negative Y-axis side when viewed from the top. The four liquid film forming devices 32a are arranged along the X-axis direction. The four liquid film forming devices 32a are disposed adjacent to each other. Each liquid film forming device 32a is in contact with the long side of the rectangular transfer block 31. The two liquid film forming devices 32a located on the negative X-axis side and the two liquid film forming devices 32a located on the positive X-axis side are configured to be axisymmetric about a virtual line L1.

The liquid film forming device 32a includes, for example, a spin chuck configured to hold the substrate W horizontally, and a nozzle configured to discharge a liquid onto a top surface of the substrate W. The nozzle supplies the liquid to a center of the top surface of the substrate W being rotated. The liquid is diffused from the center of the top surface of the substrate W toward a periphery thereof due to a centrifugal force. As an example of the liquid, a chemical liquid, a rinse liquid, and drying liquid are supplied in this order. Multiple kinds of chemical liquids may be supplied, and the rinse liquid may also be supplied between the supply of one chemical liquid and the supply of another chemical liquid.

For example, the liquid film forming device 32a forms a liquid film of a chemical liquid on the top surface of the substrate W which is held horizontally, then replaces the liquid film of the chemical liquid with a liquid film of a rinse liquid, and then replaces the liquid film of the rinse liquid with a liquid film of a drying liquid. The chemical liquid is, for example, SC1 (an aqueous solution of ammonia and hydrogen peroxide), dilute hydrofluoric acid (DHF), or the like. The rinse liquid is, for example, deionized water (DIW). The drying liquid is, for example, an organic solvent such as isopropyl alcohol (IPA).

Two drying devices 32b are provided in the processing block 32 that is located on the positive Y-axis side when viewed from the top. The two drying devices 32b are disposed along the X-axis direction. Each drying device 32b is in contact with the long side of the rectangular transfer block 31. The two drying devices 32b are provided to be axisymmetric about the virtual line L1. The two drying devices 32b are arranged with the intermediate area 32m therebetween.

The drying device 32b replaces the liquid film formed on the top surface of the horizontal substrate W with a supercritical fluid to dry the substrate W. The supercritical fluid is a fluid that has a temperature above a critical temperature and a pressure above a critical pressure, and is a fluid in a state in which it is indistinguishable whether it is a liquid or a gas. By replacing the liquid film of the dry liquid or the like with the supercritical fluid, collapse of the irregularity pattern of the substrate W due to a surface tension can be suppressed.

The supply devices 32c are provided on the negative Y-axis side of the transfer block 31. The supply devices 32c are disposed on both sides of the four liquid film forming devices 32a in the X-axis direction. The supply device 32c located on the negative X-axis side is configured to supply a fluid to the two liquid film forming devices 32a located on the negative X-axis side, for example. The supply device 32c located on the positive X-axis side is configured to supply a fluid to the two liquid film forming devices 32a located on the positive X-axis side, for example. Each supply device 32c may or may not be adjacent to the transfer block 31. This is because the substrate W is not carried to or from the supply devices 32c.

The supply device 32c is equipped with a supply device group including a flowmeter, a flow rate controller, a back-pressure valve, a heater, and so forth; and a housing that accommodates the supply device group. The supply device 32c supplies a chemical liquid, a rinse liquid, and a drying liquid to the liquid film forming device 32a as an example of the fluid.

The supply devices 32d are provided on the positive Y-axis side of the transfer block 31. The supply devices 32d are disposed on both sides of the two drying devices 32b in the X-axis direction. Each supply device 32d supplies a fluid to the neighboring drying device 32b. Each supply device 32d may or may not be adjacent to the transfer block 31. This is because the substrate W is not carried to or from the supply device 32d.

The supply device 32d is equipped with a supply device group including a flowmeter, a flow rate controller, a back-pressure valve, a heater, and so forth, and a housing that accommodates the supply device group. The supply device 32d supplies, for example, $CO_2$ as the fluid to the drying device 32b.

The inspecting device 32e is disposed on top of the drying device 32b. Alternatively, the inspecting device 32e may be disposed under the drying device 32b. The inspecting device 32e and the drying devices 32b are stacked on top of each other in the vertical direction. In this case, the footprint of the processing block 32 can be reduced.

The inspecting device 32e is configured to inspect a coating state of the substrate W covered by the liquid film. The inspecting device 32e includes, for example, a weight scale, and measures the weight of the substrate W to confirm that the irregularity pattern of the substrate W is covered with the liquid film. The inspecting device 32e may include a film thickness gauge.

The intermediate area 32m is provided between the two drying devices 32b. The intermediate area 32m lies on the virtual line L1. The intermediate area 32m is a maintenance area for an operator to maintain the two drying devices 32b.

The electrical equipment block 33 is disposed on top of the processing blocks 32 that are stacked in multiple levels. The electrical equipment block 33 may be disposed on the positive Y-axis side, for example, as illustrated in FIG. 3. The electrical equipment block 33 may be disposed along the X-axis direction, as shown in FIG. 2. The electrical equipment block 33 includes an electronic control device group configured to control the operation of the drying device 32b, and a housing that accommodates the electronic control device group.

The processing station 3 has a first unit block B1 and a second unit block B2. The first unit block B1 and the second unit block B2 are provided adjacent to each other along the X-axis direction. The first unit block B1 and the second unit block B2 are provided to be axisymmetric about the virtual line L1. Each of the first unit block B1 and the second unit block B2 may be stacked on top of each other. The processing station 3 may have only the first unit block B1 without having the second unit block B2. The processing station 3 may have three or more unit blocks along the X-axis direction.

The first unit block B1 includes the two liquid film forming devices 32a and the drying device 32b located on the negative X-axis side with respect to the imaginary line L1 when viewed from the top. The reason for combining one drying device 32b and a plurality of liquid film forming devices 32a is that the time required to process the substrate W in the liquid film forming device 32a is longer than the time taken to process the substrate W in the drying device 32b (see FIG. 4). The two liquid film forming devices 32a are disposed to be axisymmetric about a virtual line L2. The drying devices 32b has its center on the virtual line L2. In this case, a length of a transfer path of the substrate W becomes equal between each of the two liquid film forming devices 32a and the drying device 32b. Accordingly, the time taken until the liquid film formed on the top surface of the substrate W in each of the two liquid film forming device 32a is replaced with the supercritical fluid in the drying device 32b can be made equal. As a result, non-uniformity in processing quality of the substrates W processed in the respective liquid film forming devices 32a can be reduced.

The second unit block B2 includes the two liquid film forming devices 32a and the drying device 32b located on the positive X-axis side with respect to the imaginary line L1 when viewed from the top. The two liquid film forming devices 32a are disposed to be axisymmetric around the virtual line L3. The drying device 32b has its center on the virtual line L3. In this case, the length of the transfer path of the substrate W becomes equal between each of the two liquid film forming devices 32a and the drying device 32b. Accordingly, the time taken until the liquid film formed on the top surface of the substrate W in each of the two liquid film forming devices 32a is replaced with the supercritical fluid in the drying device 32b can be made equal. As a result, the non-uniformity in processing quality of the substrates W processed in the respective liquid film forming devices 32a can be reduced.

When viewed from the top, the intermediate area 32m is provided between the drying device 32b belonging to the first unit block B1 and the drying device 32b belonging to the second unit block B2 for maintenance of both drying devices 32b.

The substrate processing device 1 has a control device 4. The control device 4 is, for example, a computer, and includes a CPU (Central Processing Unit) 41 and a recording medium 42 such as a memory. The recording medium 42 stores therein a program that controls various processings performed in the substrate processing apparatus 1. The control device 4 controls an operation of the substrate processing apparatus 1 by causing the CPU 41 to execute the program stored in the recording medium 42.

Substrate Processing Method

With reference to FIG. 4 to FIG. 22, a substrate processing method according to the exemplary embodiment will be described. FIG. 4 is a timing chart showing the substrate processing method according to the exemplary embodiment. FIG. 4 presents transfer timings for a plurality of substrates W1 to W9 when a substrate processing is performed continually on these substrates W1 to W9. FIG. 5 to FIG. 22 are plan views showing the substrate processing method according to the exemplary embodiment. The substrates W1 to W9 in FIG. 5 to FIG. 22 correspond to the substrates W1 to W9 in FIG. 4. The substrate processing method described in FIG. 4 to FIG. 22 are performed under the control of the control device 4.

Hereinafter, a substrate transfer process performed by the second transfer device 31a is referred to as "PRA". Further, liquid film forming processes performed in the liquid film forming device 32a on the negative X-axis side and the liquid film forming device 32a on the positive X-axis side included in the first unit block B1 are referred to as "SPIN1" and "SPIN2," respectively. In addition, a supercritical drying process performed in the drying device 32b included in the first unit block B1 is referred to as "SCC1". Further, liquid film forming processes performed in the liquid film forming device 32a on the negative X-axis side and the liquid film forming device 32a on the positive X-axis included in the second unit block B2 are referred to as "SPIN3" and "SPIN4", respectively. Additionally, a supercritical drying process performed in the drying device 32b included in the second unit block B2 is referred to as "SCC2".

Figure 5:
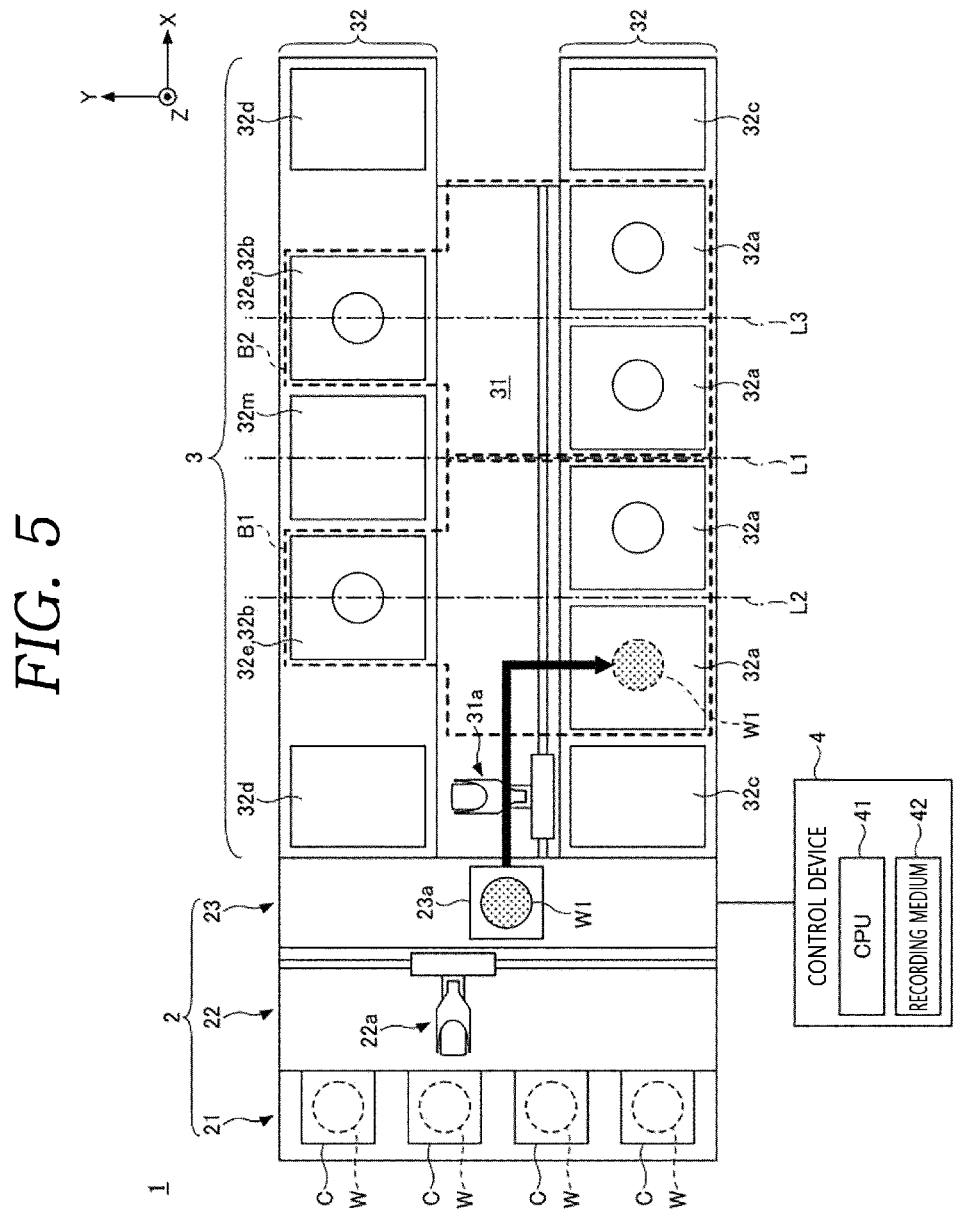
FIG. 5 is a plan view showing the substrate processing method according to the exemplary embodiment.

First, as shown in FIG. 5, the second transfer device 31a takes out the substrate W1 from the transition device 23a, and transfers the taken out substrate W1 to the liquid film forming device 32a on the negative X-axis side in the first unit block B1. In the liquid film forming device 32a, the liquid film forming process (SPIN1) is performed on the substrate W1, as shown in FIG. 4. Specifically, the liquid film forming device 32a supplies the chemical liquid to the top surface of the substrate W1 that is held horizontally. The chemical liquid is supplied to the center of the top surface of the substrate W1 being rotated, and is diffused to the entire top surface of the substrates W1 in a radial direction by a centrifugal force to form a liquid film. Then, the liquid film forming device 32a supplies the rinse liquid to the top surface of the substrate W1 that is held horizontally. The rinse liquid is supplied to the center of the top surface of the substrate W1 being rotated, and is diffused to the entire top surface of the substrate W1 in the radial direction by the centrifugal force to form a liquid film. As a result, the liquid film of the chemical liquid is replaced with the liquid film of the rinse liquid. Next, the liquid film forming devices 32a supplies the drying liquid to the top surface of the substrate W1 that is held horizontally. The drying liquid is supplied to the center of the top surface of the substrate W1 being rotated, and is diffused to the entire top surface of the substrate W1 in the radial direction by the centrifugal force to form a liquid film. As a result, the liquid film of the rinse liquid is replaced with the liquid film of the drying liquid.

Figure 6:
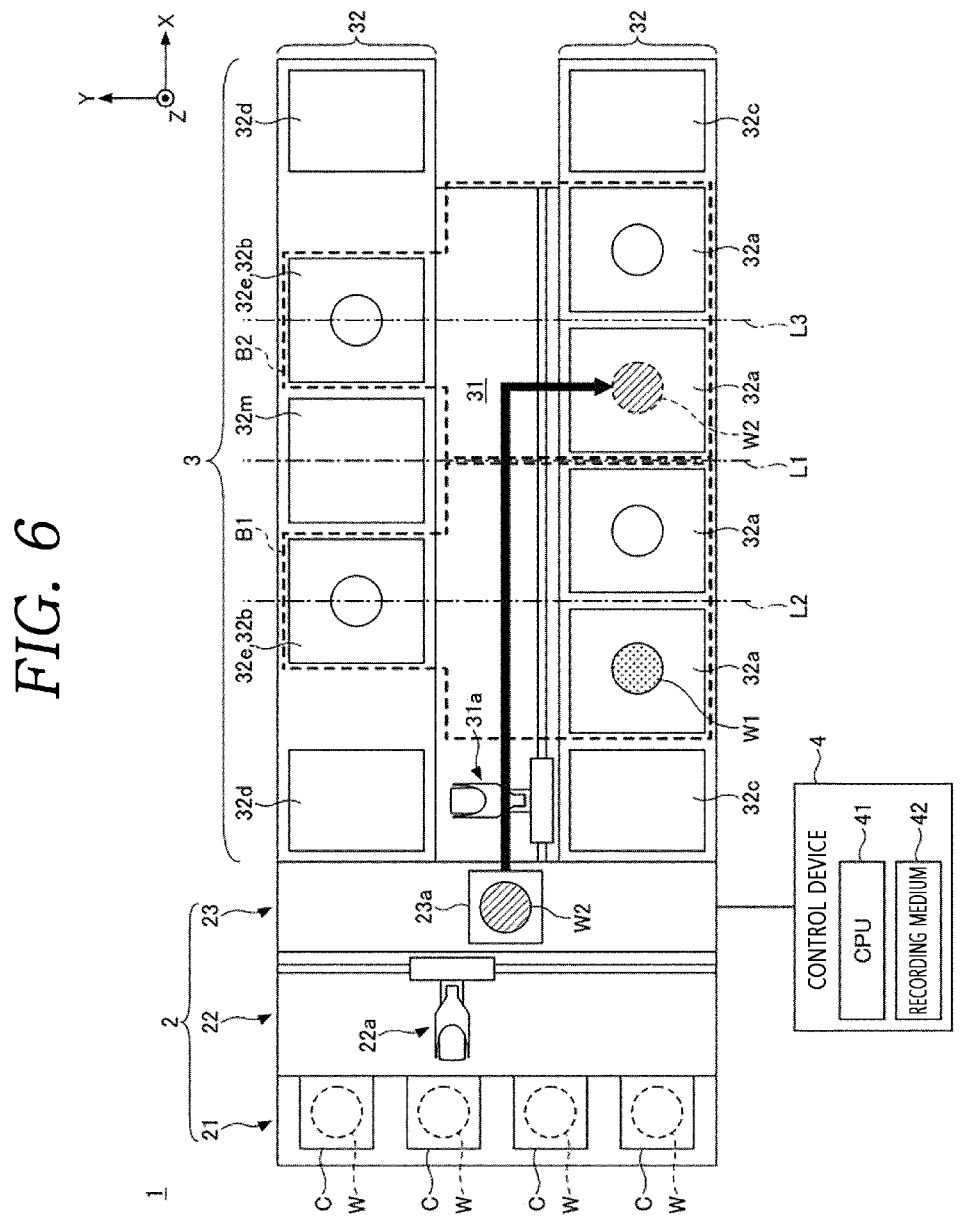
FIG. 6 is a plan view showing the substrate processing method according to the exemplary embodiment.

Subsequently, as shown in FIG. 6, the second transfer device 31a takes out the substrate W2 from the transition device 23a, and transfers the taken substrate W2 to the liquid film forming device 32a on the negative X-axis side in the second unit block B2. In the liquid film forming device 32a, the liquid film forming process (SPIN3) is performed on the substrate W2, as shown in FIG. 4. The liquid film forming process (SPIN3) may be the same process as the liquid film forming process (SPIN1).

Figure 7:
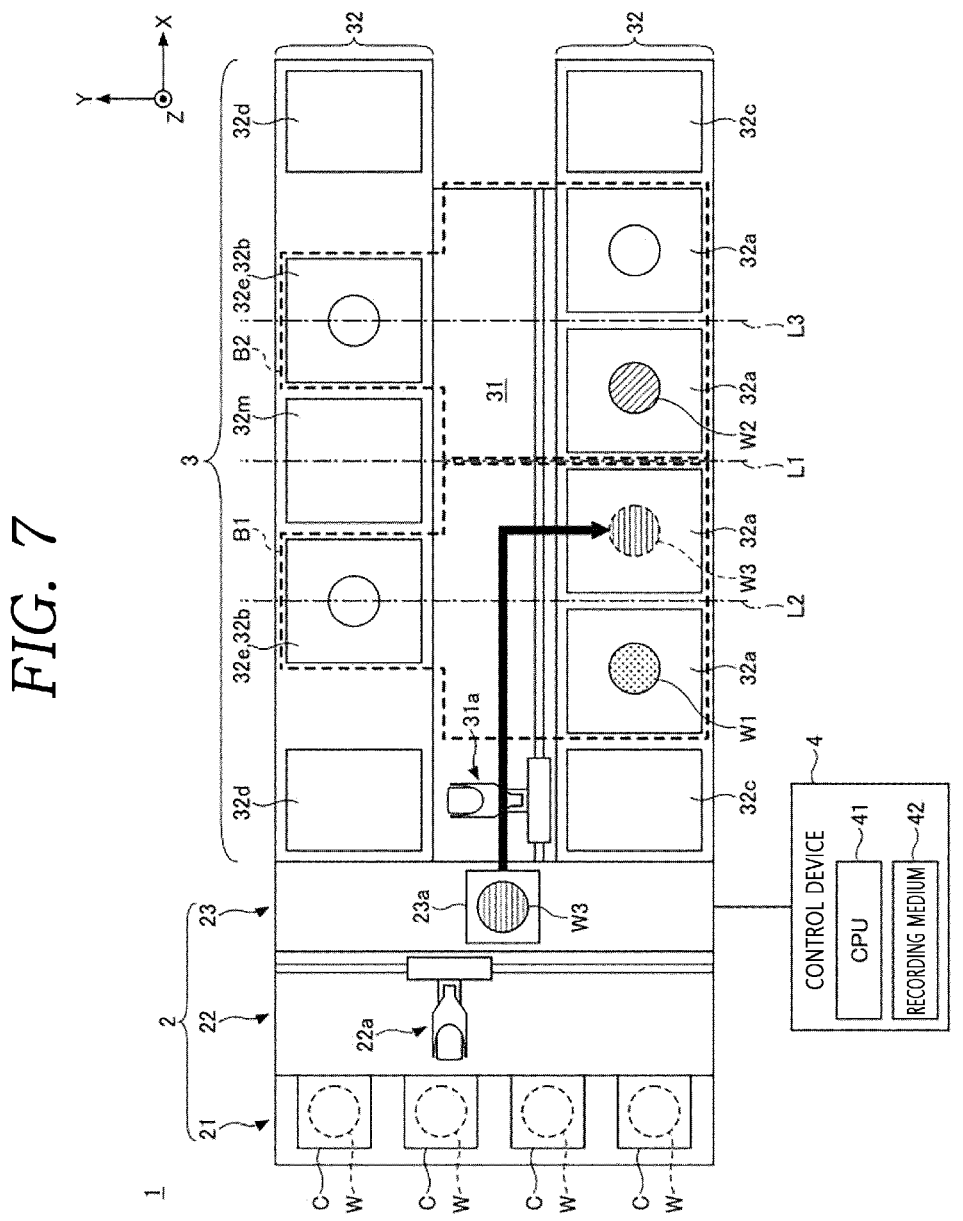
FIG. 7 is a plan view showing the substrate processing method according to the exemplary embodiment.

Next, as shown in FIG. 7, the second transfer device 31a takes out the substrate W3 from the transition device 23a, and transfers the taken substrate W3 to the liquid film forming device 32a on the positive X-axis side in the first unit block B1. In the liquid film forming device 32a, the liquid film forming process (SPIN2) is performed on the substrate W3, as shown in FIG. 4. The liquid film forming process (SPIN2) may be the same process as the liquid film forming process (SPIN1).

Figure 8:
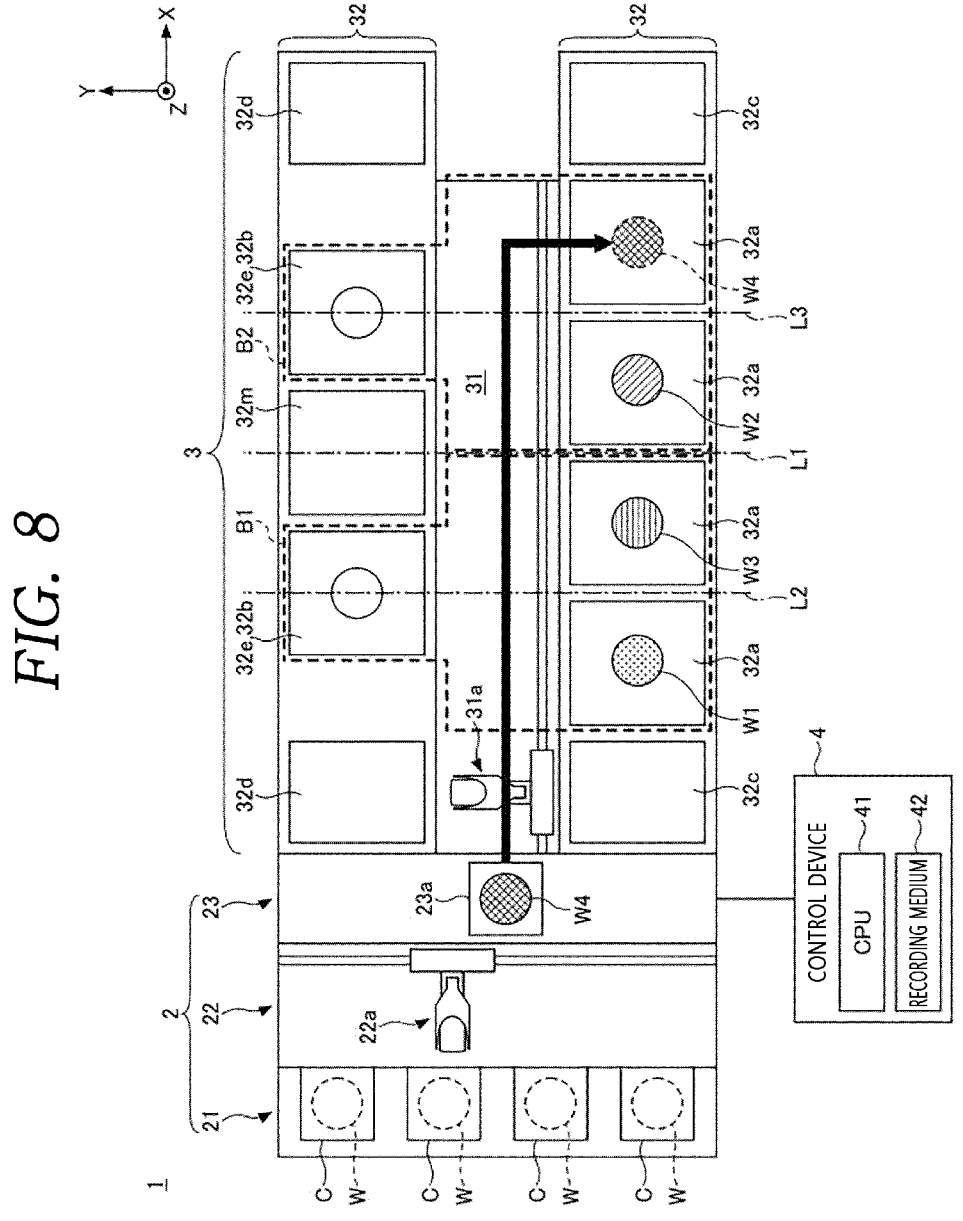
FIG. 8 is a plan view showing the substrate processing method according to the exemplary embodiment.

Thereafter, as shown in FIG. 8, the second transfer device 31a takes out the substrate W4 from the transition device 23a, and transfers the taken substrate W4 to the liquid film forming device 32a on the positive X-axis side in the second unit block B2. In the liquid film forming device 32a, the liquid film forming process (SPIN4) is performed on the substrate W4, as shown in FIG. 4. The liquid film forming process (SPIN4) may be the same process as the liquid film forming process (SPIN1).

Figure 9:
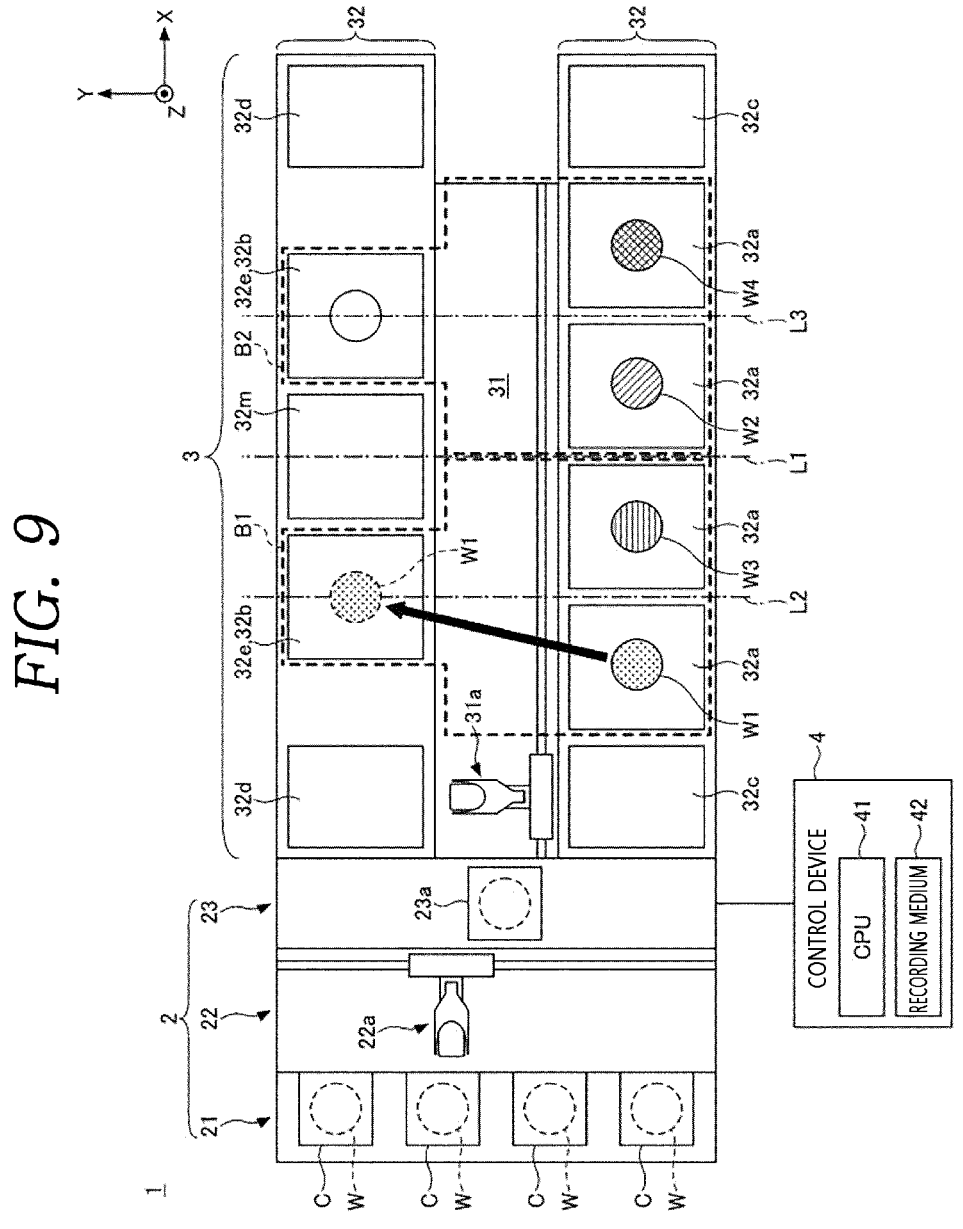
FIG. 9 is a plan view showing the substrate processing method according to the exemplary embodiment.

Then, as shown in FIG. 9, the second transfer device 31a takes out the substrate W1 from the liquid film forming device 32a on the negative X-axis side in the first unit block B1, and transfers the taken substrate W1 to the drying device 32b of the first unit block B1. In the drying device 32b, the supercritical drying process (SCC1) is performed on the substrate W1, as shown in FIG. 4. Specifically, the drying device 32b replaces the liquid film formed on the top surface of the substrate W1, which is held horizontally, with the supercritical fluid to thereby dry the substrate W1. By replacing the liquid film such as the drying liquid with the supercritical fluid, it is possible to suppress appearance of an interface between the liquid and the gas in the irregularity pattern of the substrate W1. As a result, generation of a surface tension can be suppressed, so that the collapse of the irregularity pattern can be suppressed.

Figure 10:
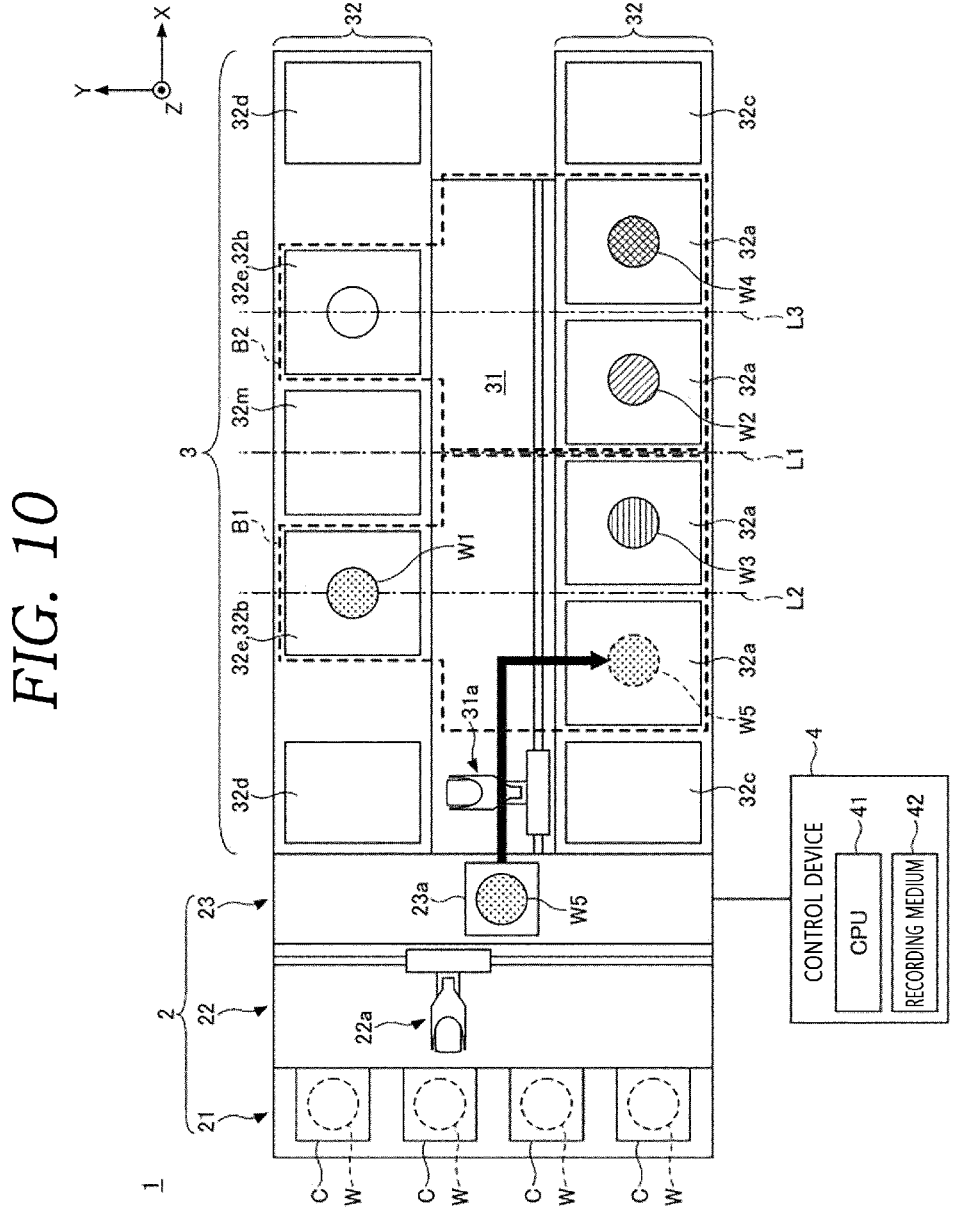
FIG. 10 is a plan view showing the substrate processing method according to the exemplary embodiment.

Subsequently, as shown in FIG. 10, the second transfer device 31a takes out the substrate W5 from the transition device 23a, and transfers the taken substrate W5 to the liquid film forming device 32a on the negative X-axis side in the first unit block B1. In the liquid film forming device 32a, the liquid film forming process (SPIN1) is performed on the substrate W5, as shown in FIG. 4.

Figure 11:
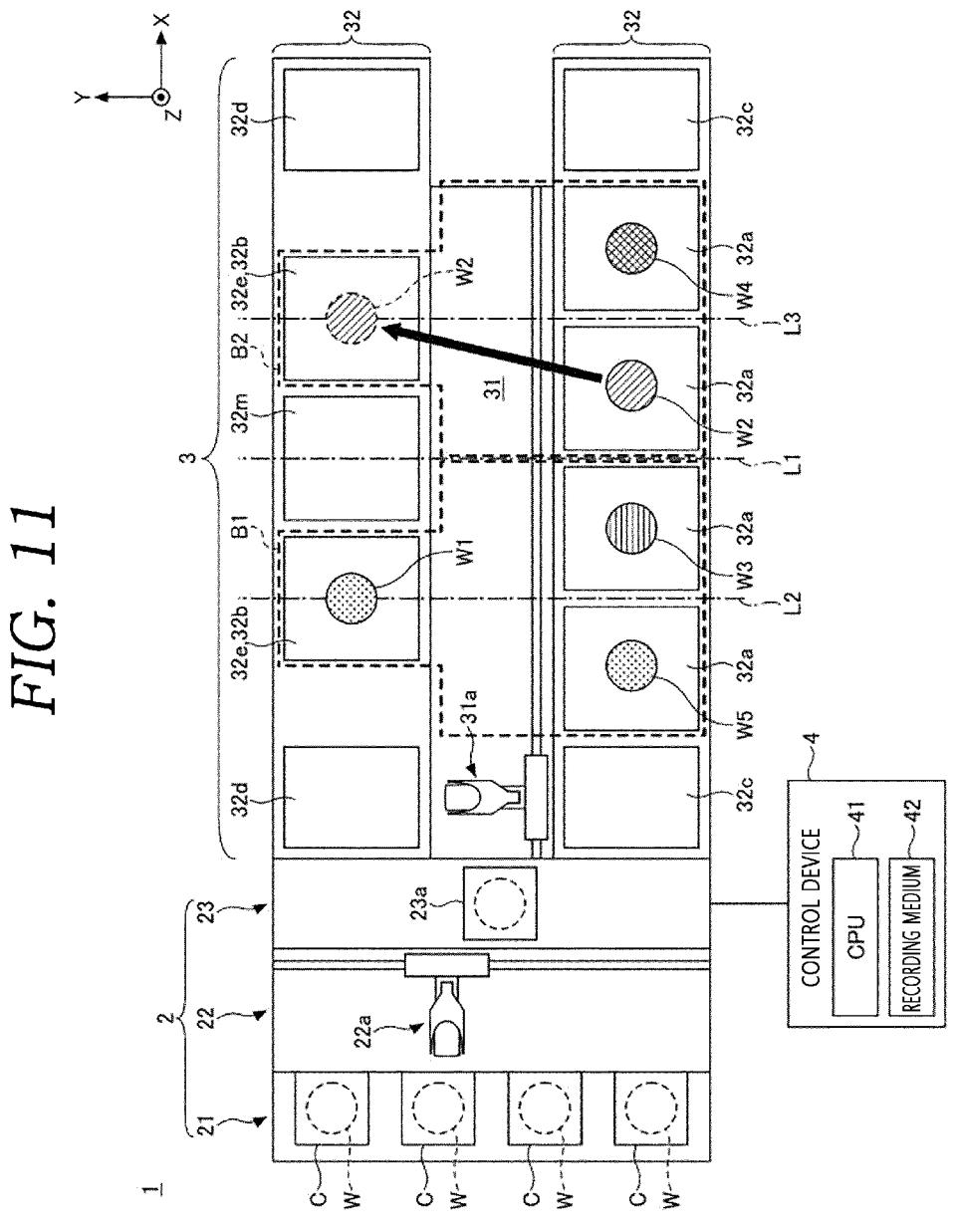
FIG. 11 is a plan view showing the substrate processing method according to the exemplary embodiment.

Next, as shown in FIG. 11, the second transfer device 31a takes out the substrate W2 from the liquid film forming device 32a on the negative X-axis in the second unit block B2, and transfers the taken substrate W2 to the drying device 32b of the second unit block B2. In the drying device 32b, the supercritical drying process (SCC2) is performed on the substrate W2, as shown in FIG. 4.

Figure 12:
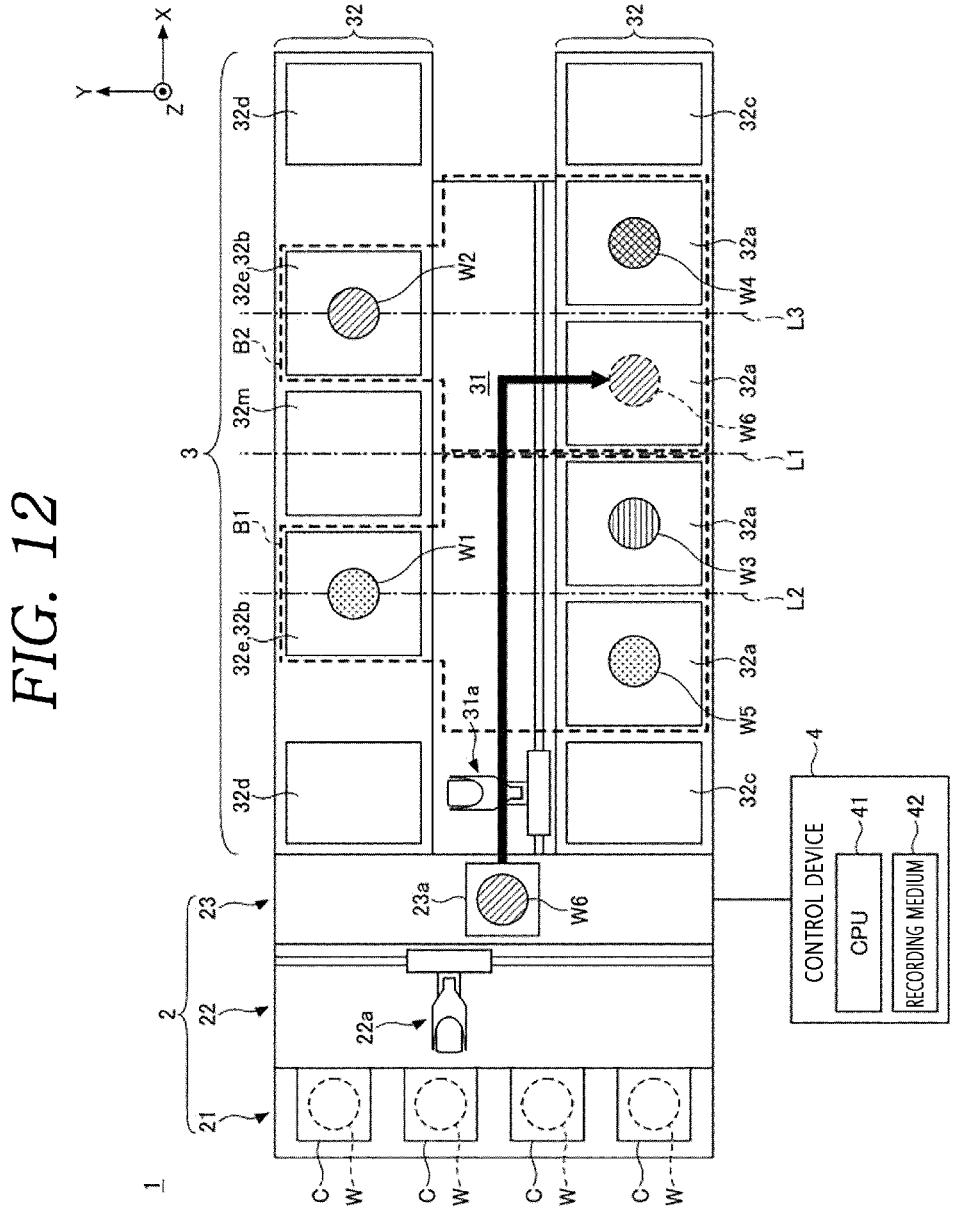
FIG. 12 is a plan view showing the substrate processing method according to the exemplary embodiment.

Then, as shown in FIG. 12, the second transfer device 31a takes out the substrate W6 from the transition device 23a, and transfers the taken substrate W6 to the liquid film forming device 32a on the negative X-axis side in the second unit block B2. In the liquid film forming device 32a, the liquid film forming process (SPIN3) is performed on the substrate W6, as shown in FIG. 4.

Figure 13:
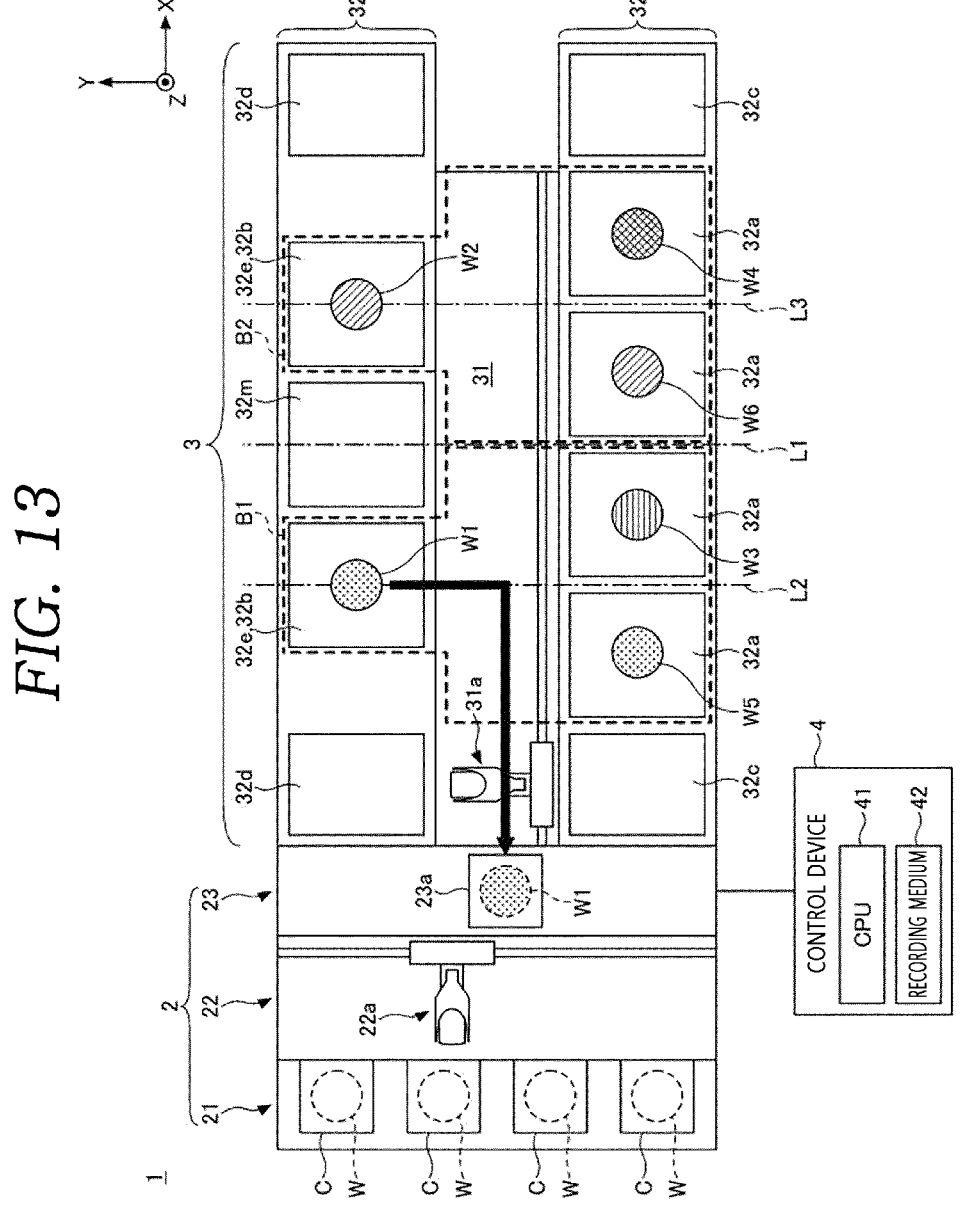
FIG. 13 is a plan view showing the substrate processing method according to the exemplary embodiment.

Thereafter, as shown in FIG. 13, the second transfer device 31a takes out the substrate W1 from the drying device 32b of the first unit block B1, and transfers the taken substrate W1 to the transition device 23a.

Figure 14:
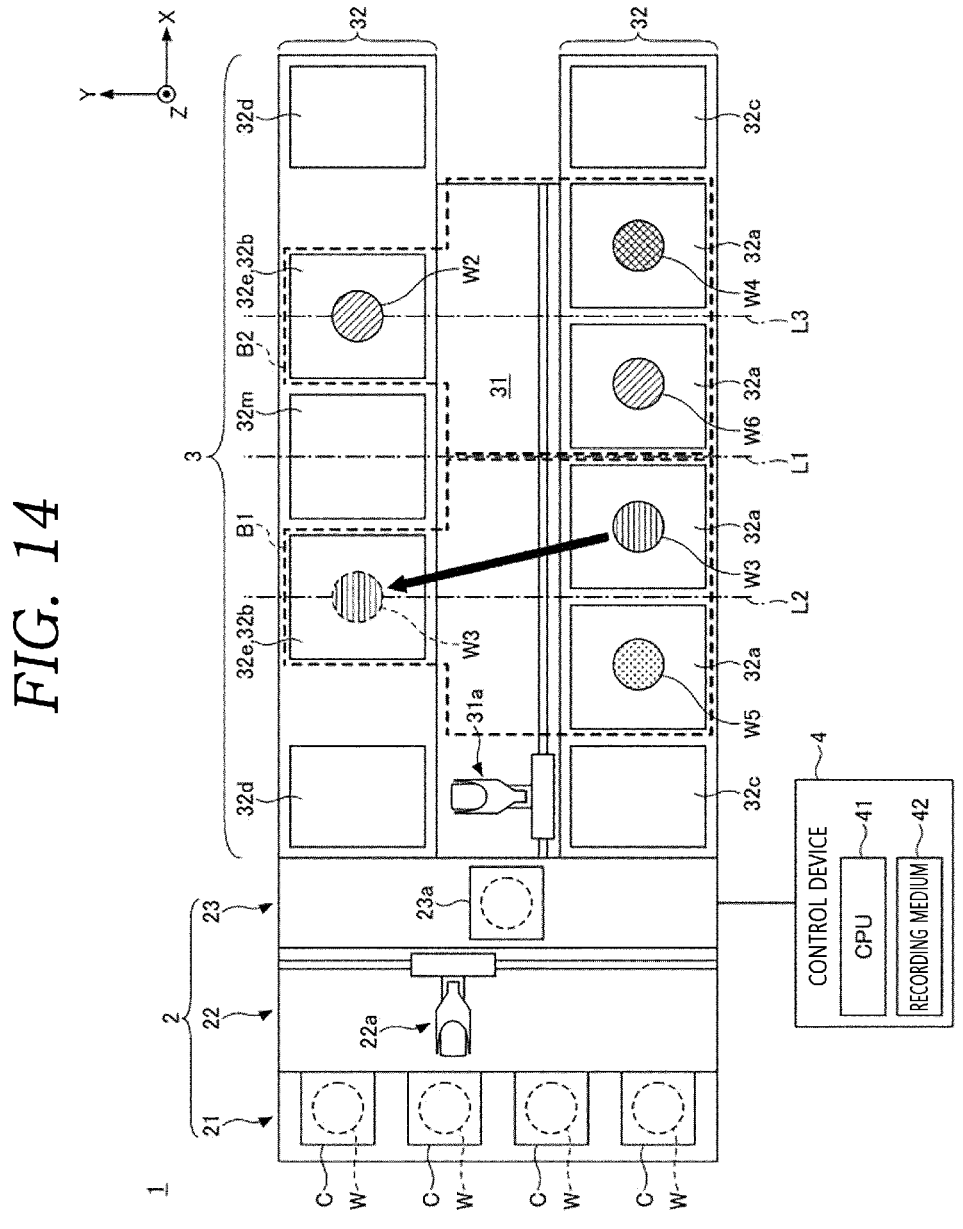
FIG. 14 is a plan view showing the substrate processing method according to the exemplary embodiment.

Afterwards, as shown in FIG. 14, the second transfer device 31a takes out the substrate W3 from the liquid film forming device 32a on the positive X-axis side in the first unit block B1, and transfers the taken substrate W3 to the drying device 32b of the first unit block B1. In the drying device 32b, the supercritical drying process (SCC1) is performed on the substrate W3, as shown in FIG. 4. Here, the two liquid film forming devices 32a of the first unit block B1 are arranged axisymmetrically about the virtual line L2, and the drying device 32b of the first unit block B1 has its center on the virtual line L2. In this case, the length of the transfer path of the substrate W1 between the liquid film forming device 32a on the negative X-axis side and the drying device 32b, and the length of transfer path of the substrate W3 between the liquid film forming device 32a on the positive X-axis side and the drying device 32b become equal. Accordingly, the times taken until the liquid film formed on the top surface of the substrate W1 in the liquid film forming device 32a on the negative X-axis side and the liquid film formed on the top surface of the substrate W3 in the liquid film forming device 32a on the positive X-axis side are replaced with the supercritical fluid in the drying device 32b can be made equal. As a result, the non-uniformity in processing quality between the substrate W1 processed by the liquid film forming device 32a on the negative X-axis side and the substrate W3 processed by the liquid film forming device 32a on the positive X-axis side can be reduced. As depicted in FIG. 4, an end time of the liquid film formation process (SPIN2) performed on the substrate W3 may be adjusted to be the same as an end time of the supercritical drying process (SCC1) performed on the substrate W1. In this case, after the liquid film forming process (SPIN2) is completed, the substrate W3 can be transferred to the drying device 32b without standing by in the liquid film forming device 32a. Accordingly, the liquid film of the drying liquid formed on the top surface of the substrate W3 by the liquid film forming process (SPIN2) can be suppressed from being dried. Therefore, the collapse of the irregularity pattern of the substrate W3 can be suppressed. Alternatively, the end time of the liquid film formation process (SPIN2) performed on the substrate W3 may be adjusted to be later than the end time of the supercritical drying process (SCC1) performed on the substrate W1. In this case as well, the substrate W3 can be transferred to the drying device 32b without standing by in the liquid film forming device 32a.

Figure 15:
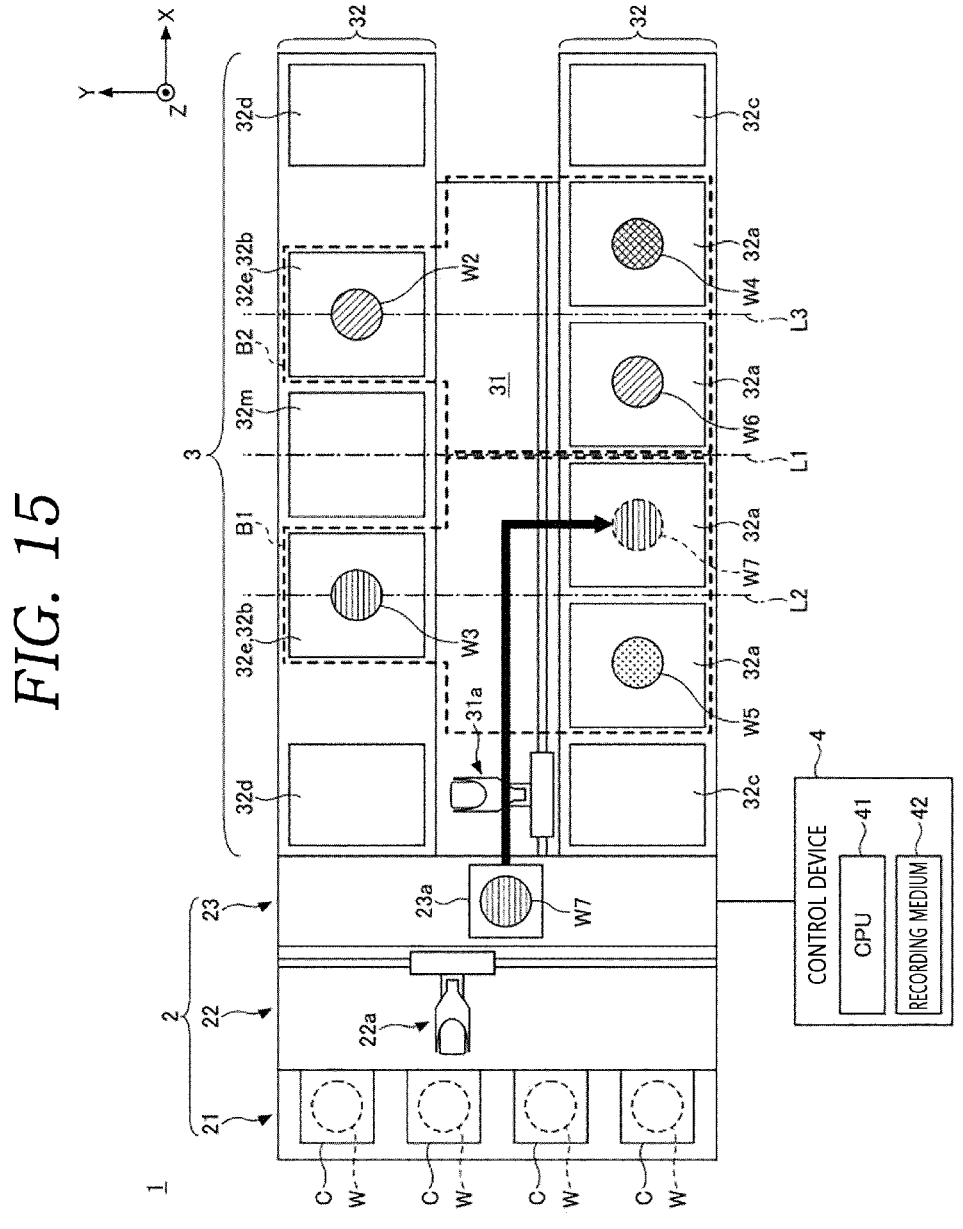
FIG. 15 is a plan view showing the substrate processing method according to the exemplary embodiment.

Next, as shown in FIG. 15, the second transfer device 31a takes out the substrate W7 from the transition device 23a, and transfers the taken substrate W7 to the liquid film forming device 32a on the positive X-axis side in the first unit block B1. In the liquid film forming device 32a, the liquid film forming process SPIN2 is performed on the substrate W7, as shown in FIG. 4.

Figure 16:
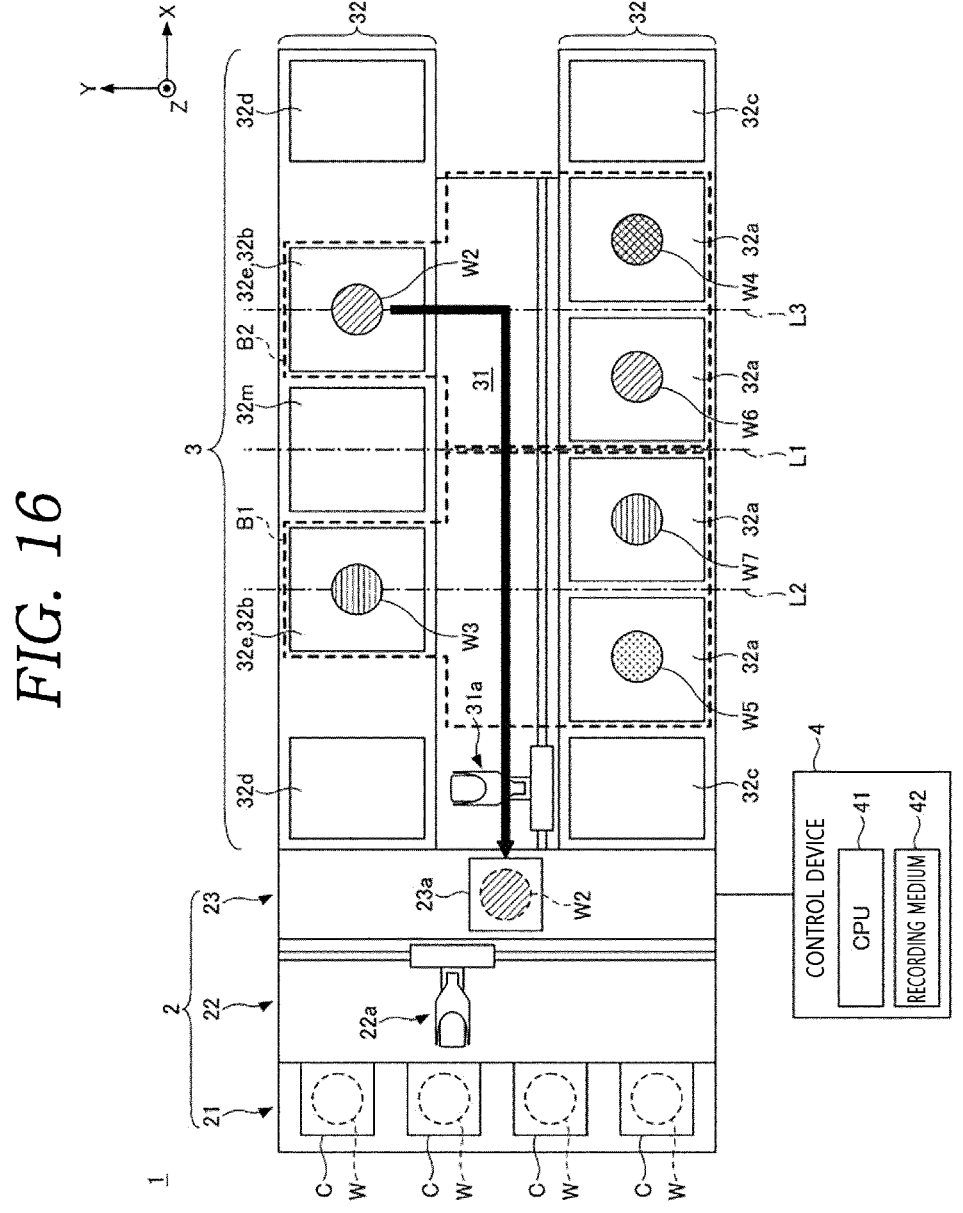
FIG. 16 is a plan view showing the substrate processing method according to the exemplary embodiment.

Then, as shown in FIG. 16, the second transfer device 31a takes out the substrate W2 from the drying device 32b of the second unit block B2, and transfers the taken substrate W2 to the transition device 23a.

Figure 17:
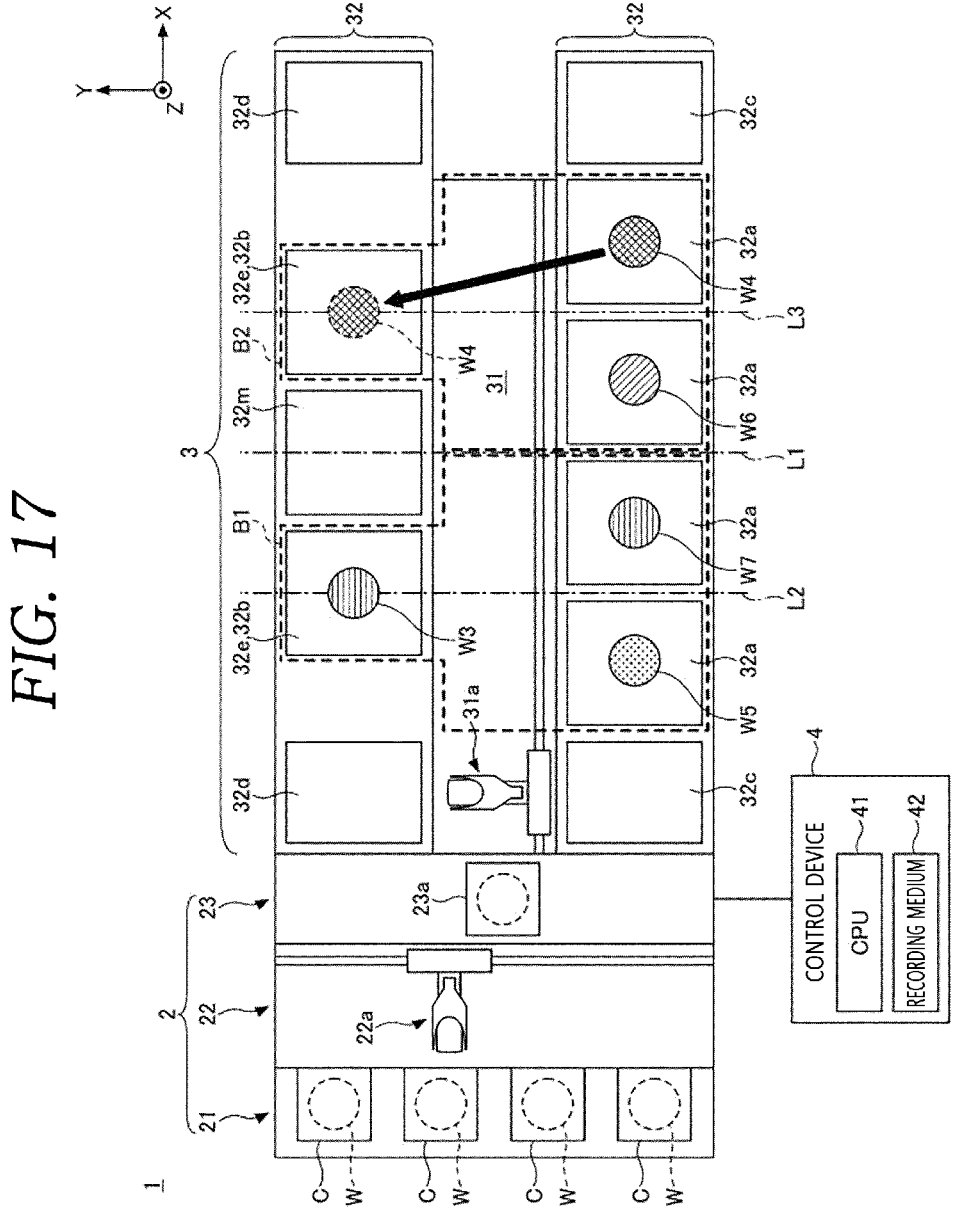
FIG. 17 is a plan view showing the substrate processing method according to the exemplary embodiment.

Subsequently, as shown in FIG. 17, the second transfer device 31a takes out the substrate W4 from the liquid film forming device 32a on the positive X-axis side in the second unit block B2, and transfers the taken substrate W4 to the drying device 32b of the second unit block B2. In the drying device 32b, the supercritical drying process (SCC2) is performed on the substrate W4, as shown in FIG. 4. Here, the two liquid film forming devices 32a of the second unit block B2 are arranged axisymmetrically about a virtual line L3, and the drying device 32b of the second unit block B2 has its center on the virtual line L3. In this case, the length of the transfer path of the substrate W2 between the liquid film forming device 32a on the negative X-axis side and the drying device 32b, and the length of the transfer path of the substrate W4 between the liquid film forming device 32a on the positive X-axis side and the drying device 32b become equal. Accordingly, the times taken until the liquid film formed on the top surface of the substrate W2 by the liquid film forming device 32a on the negative X-axis side and the liquid film formed on the top surface of the substrate W4 by the liquid film forming device 32a on the positive X-axis side are replaced with the supercritical fluid in the drying device 32b can be made equal. As a result, the non-uniformity in processing quality between the substrate W2 processed by the liquid film forming device 32a on the negative X-axis side and the substrate W4 processed by the liquid film forming device 32a on the positive X-axis side can be reduced. As illustrated in FIG. 4, an end time of the liquid film forming process (SPIN4) performed on the substrate W4 may be adjusted to be the same as an end time of the supercritical drying process (SCC2) performed on the substrate W2. In this case, after the liquid film forming process (SPIN4) is completed, the substrate W4 can be transferred to the drying device 32b without standing by in the liquid film forming device 32a. Thereby, drying of the liquid film of the drying liquid formed on the top surface of the substrate W4 by the liquid film forming process (SPIN4) can be suppressed. For this reason, the collapse of the irregularity pattern of the substrate W4 can be suppressed. Alternatively, the end time of the liquid film forming process (SPIN4) performed on the substrate W4 may be adjusted to be later than the end time of the supercritical drying process (SCC2) performed on the substrate W2. In this case as well, the substrate W4 can be transferred to the drying device 32b without standing by in the liquid film forming device 32a.

Figure 18:
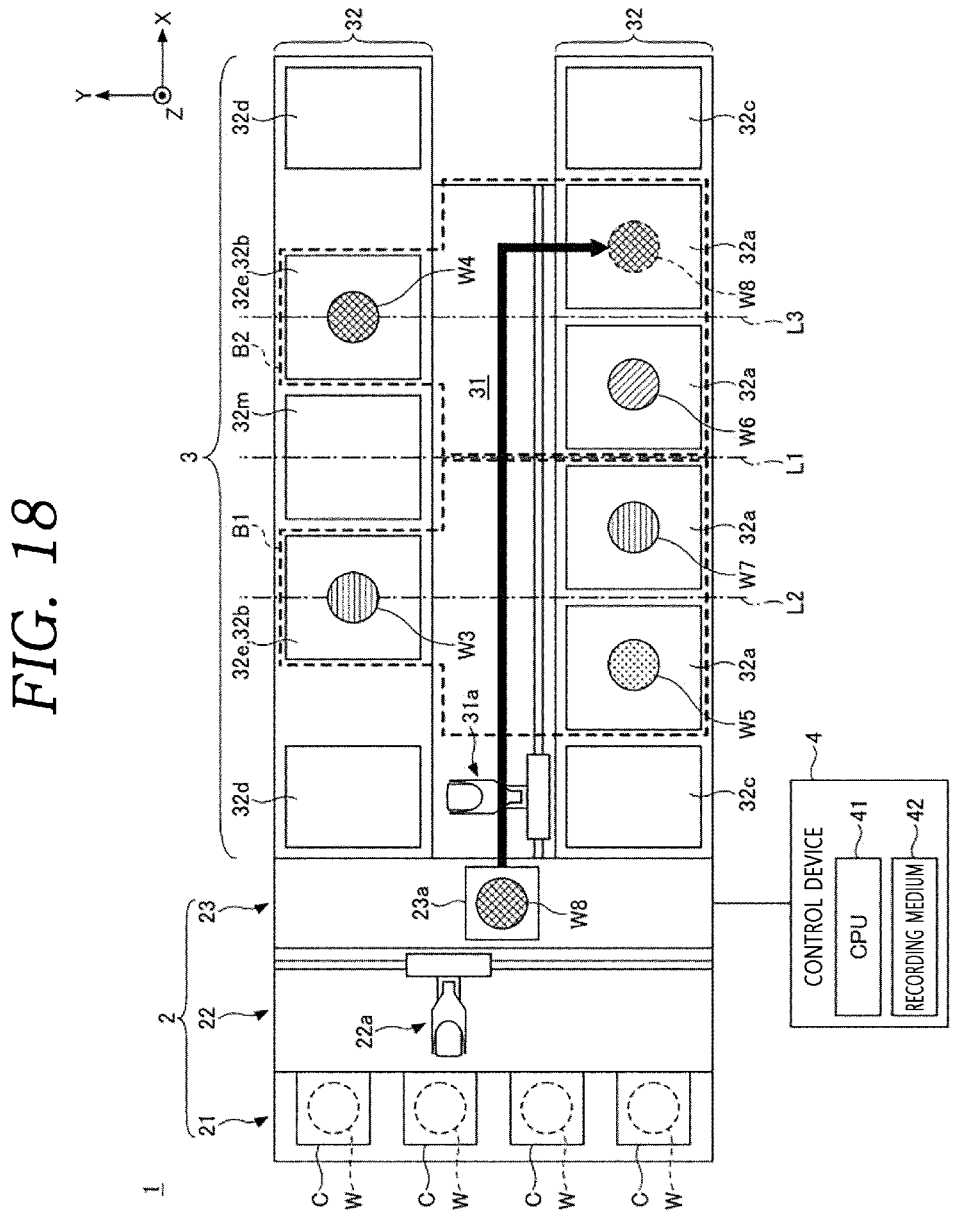
FIG. 18 is a plan view showing the substrate processing method according to the exemplary embodiment.

Thereafter, as shown in FIG. 18, the second transfer device 31a takes out the substrate W8 from the transition device 23a, and transfers the taken substrate W8 to the liquid film forming device 32a on the positive X-axis side in the second unit block B2. In the liquid film forming device 32a, the liquid film forming process (SPIN4) is performed on the substrate W8, as shown in FIG. 4.

Figure 19:
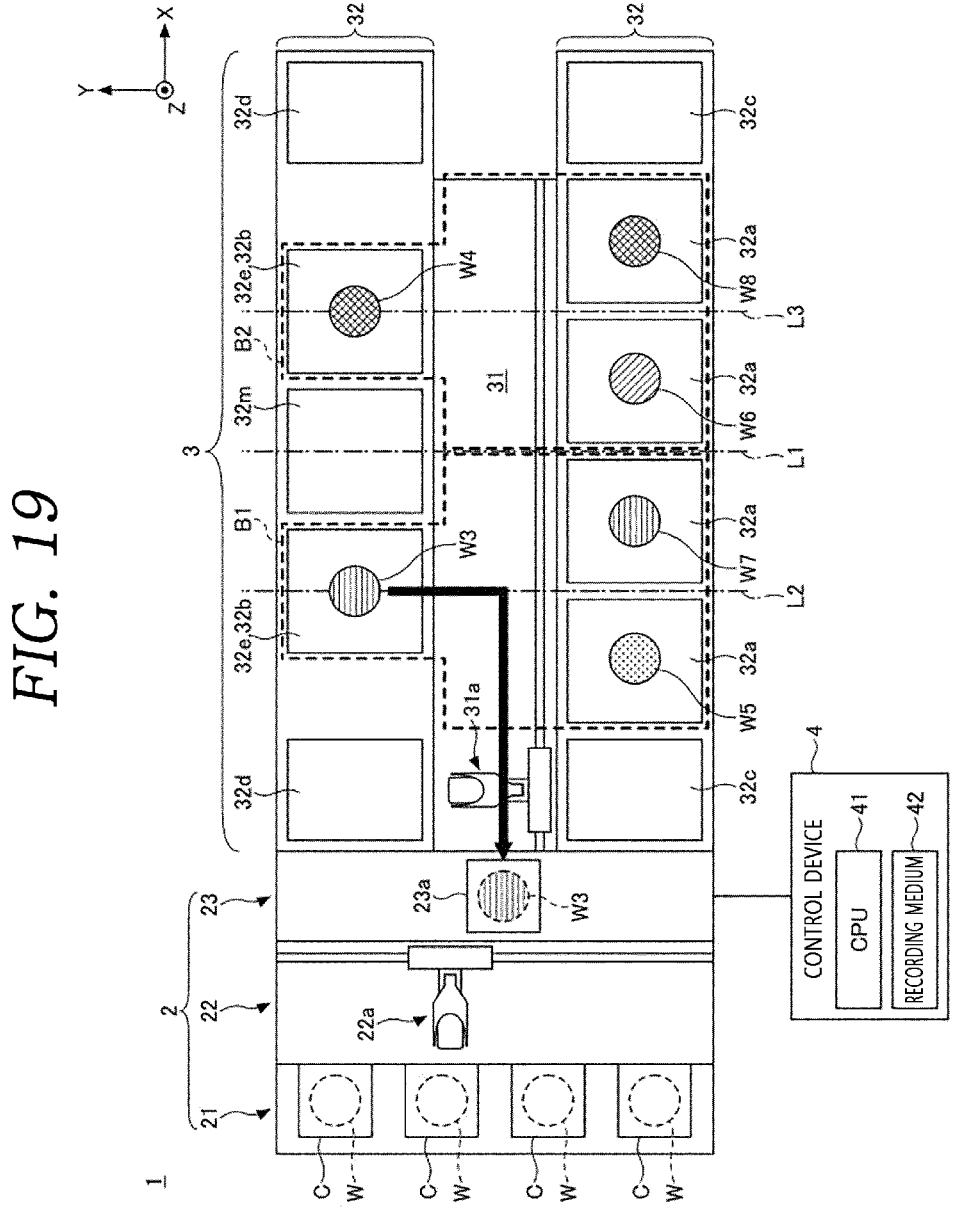
FIG. 19 is a plan view showing the substrate processing method according to the exemplary embodiment.

Then, as depicted in FIG. 19, the second transfer device 31a takes out the substrate W3 from the drying device 32b of the first unit block B1, and transfers the taken substrate W3 to the transition device 23a.

Figure 20:
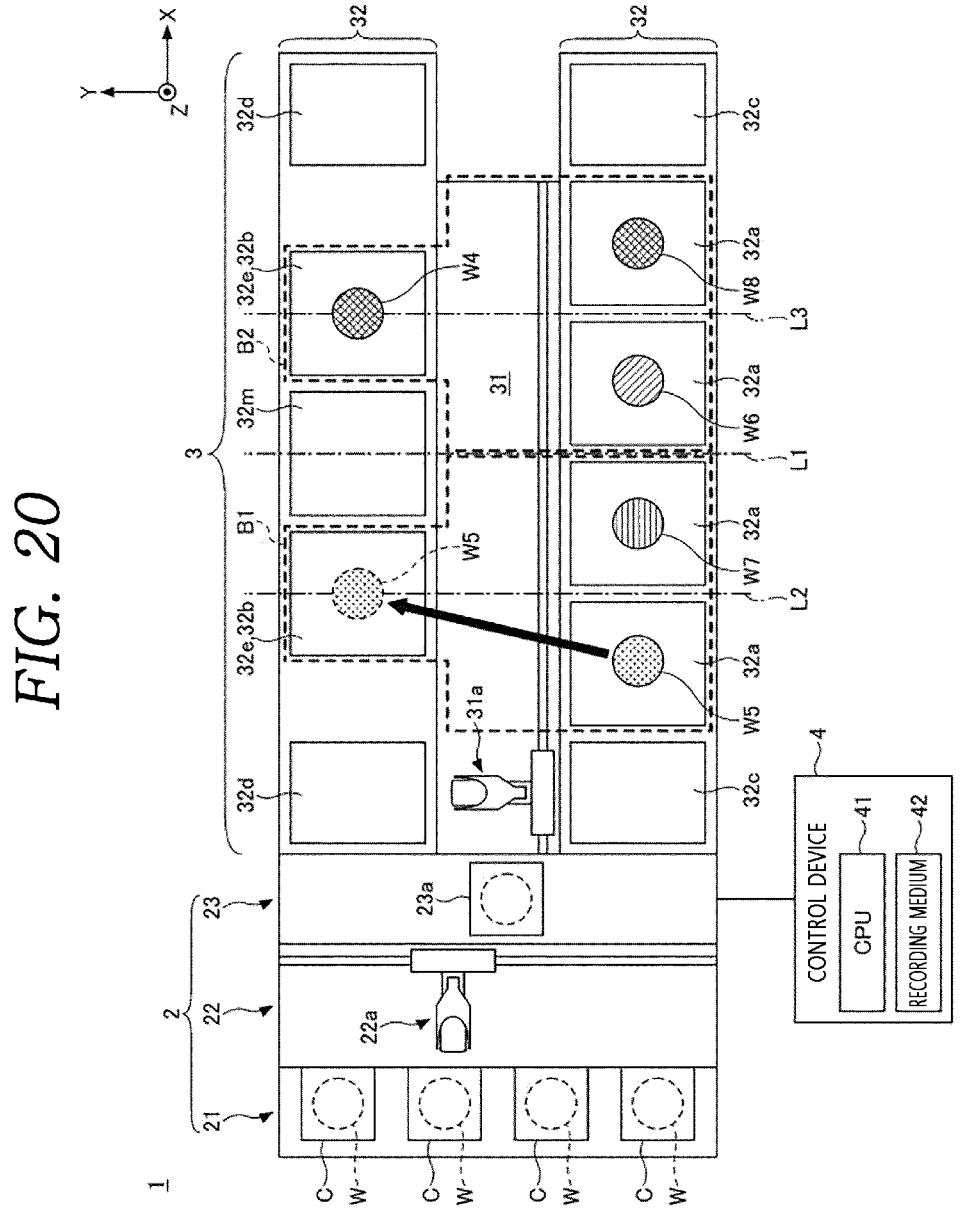
FIG. 20 is a plan view showing the substrate processing method according to the exemplary embodiment.

Next, as shown in FIG. 20, the second transfer device 31a takes out the substrate W5 from the liquid film forming device 32a on the negative X-axis side in the first unit block B1, and transfers the taken substrate W5 to the drying device 32b of the first unit block B1. In the drying device 32b, the supercritical drying process (SCC1) is performed on the substrate W5, as shown in FIG. 4. As depicted in FIG. 4, an end time of the liquid film formation process (SPIN1) performed on the substrate W5 may be adjusted to be the same as an end time of the supercritical drying process (SCC1) performed on the substrate W3. In this case, after the liquid film forming process (SPIN1) is completed, the substrate W5 can be transferred to the drying device 32b without standing by in the liquid film forming device 32a. Accordingly, the liquid film of the drying liquid formed on the top surface of the substrate W5 by the liquid film forming process (SPIN1) can be suppressed from being dried. Thus, the collapse of the irregularity pattern of the substrate W5 can be suppressed. Alternatively, the end time of the liquid film formation process (SPIN1) performed on the substrate W5 may be adjusted to be later than the end time of the supercritical drying process (SCC1) performed on the substrate W3. In this case as well, the substrate W5 can be transferred to the drying device 32b without standing by in the liquid film forming device 32a.

Figure 21:
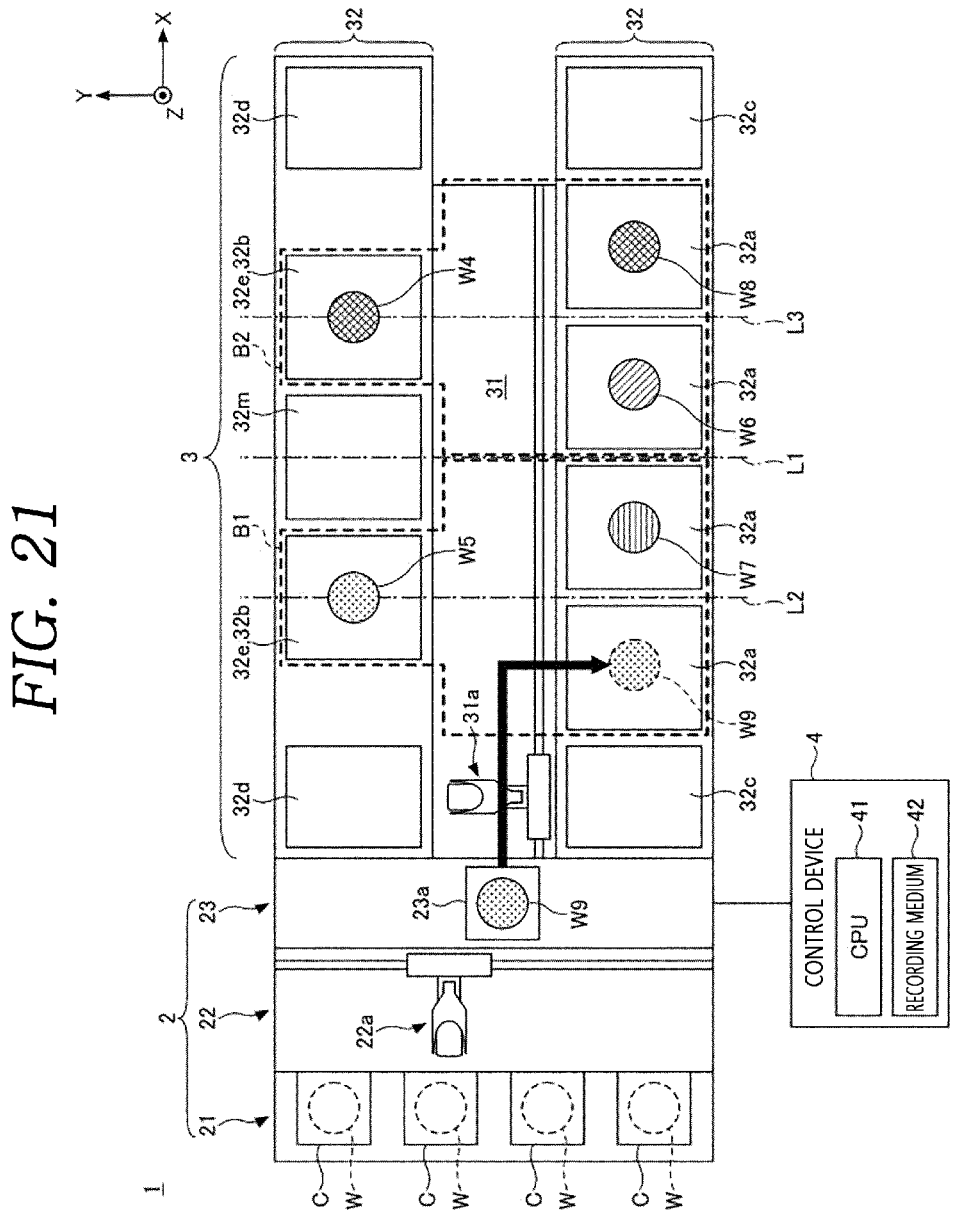
FIG. 21 is a plan view showing the substrate processing method according to the exemplary embodiment.

Thereafter, as shown in FIG. 21, the second transfer device 31a takes out the substrate W9 from the transition device 23a, and transfers the taken substrate W9 to the liquid film forming device 32a on the negative X-axis side in the first unit block B1. In the liquid film forming device 32a, the liquid film forming process (SPIN1) is performed on the substrate W9, as shown in FIG. 4.

Figure 22:
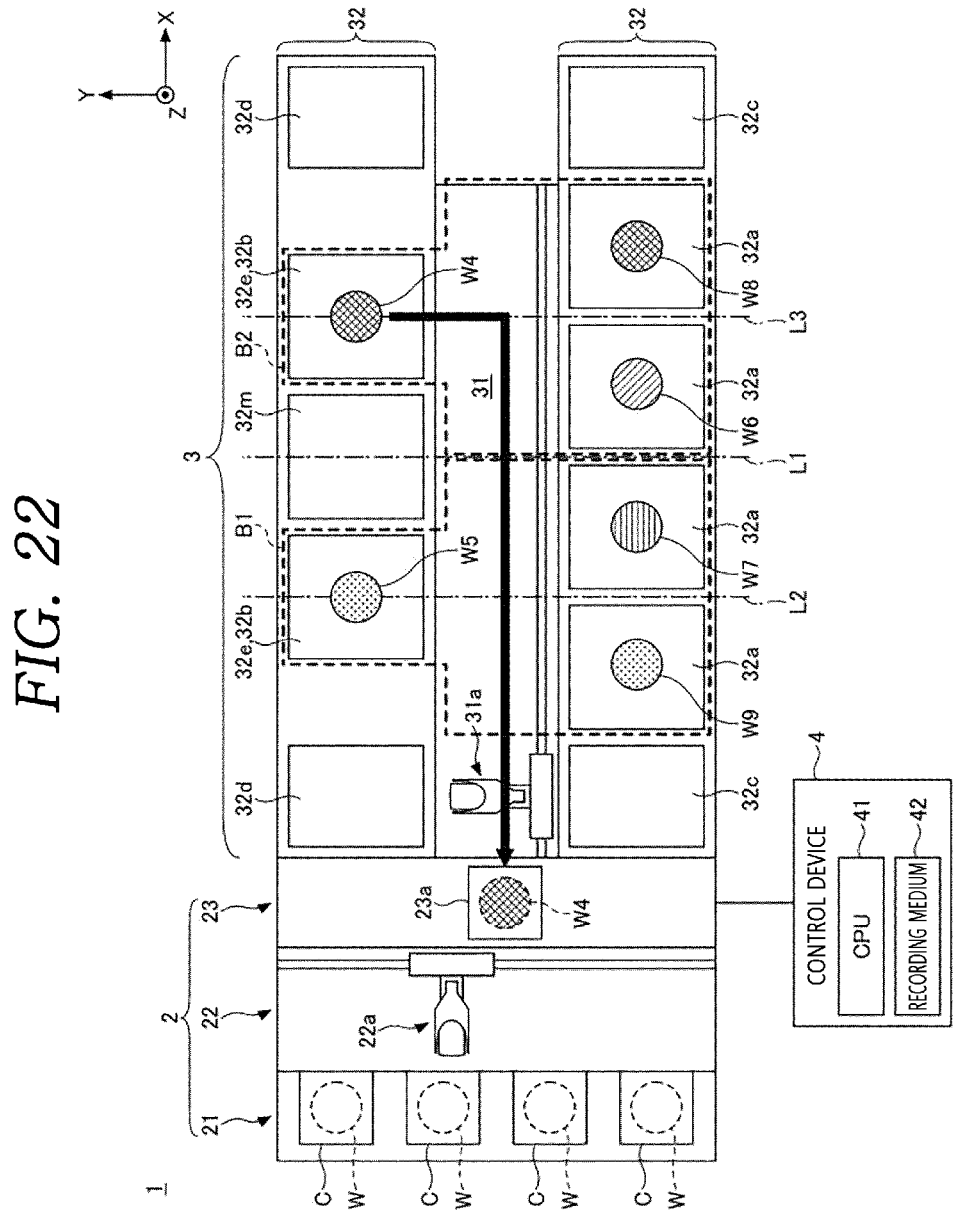
FIG. 22 is a plan view showing the substrate processing method according to the exemplary embodiment.

Then, as shown in FIG. 22, the second transfer device 31a takes out the substrate W4 from the drying device 32b of the second unit block B2, and transfers the taken substrate W4 to the transition device 23a.

Afterwards, by repeating the operations shown in FIG. 11 to FIG. 22, the multiple substrates W can be processed continually.

Intermediate Area

Referring to FIG. 23A and FIG. 23B, a state of the intermediate area 32m when the substrate processing apparatus 1 is in operation will be described. FIG. 23A and FIG. 23B are diagrams illustrating the intermediate area 32b when the device is in operation. FIG. 23A and FIG. 23B are a plan view and a side view, respectively, showing a part of the processing block 32 including the intermediate area 32m.

As shown in FIG. 23A and FIG. 23B, when the device is in operation, a door 101 is closed, so the intermediate area 32m is isolated from an external space. The door 101 may be, for example, of a left-right swing type. An electronic control device group that controls the operation of the drying device 32b may be provided to an inner surface of the door 101. In the intermediate area 32m, a workbench 103 is provided. The workbench 103 includes a step stool 104 and a ladder 105. The step stool 104 is fixed at a height position approximately on a level with the drying device 32b of an intermediate level. The ladder 105 is fixed to the step stool 104. The ladder 105 is configured to be foldable. When the device is in operation, the ladder 105 is folded and placed on the step stool 104.

Figure 24A:
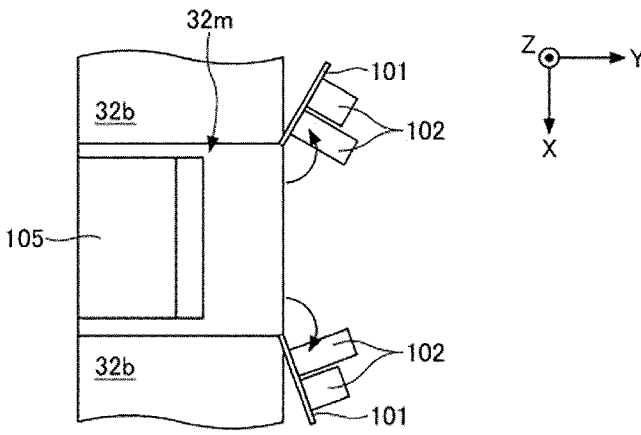
FIG. 24A and FIG. 24B are diagrams showing the intermediate area during maintenance of a lower level.
Figure 24B:
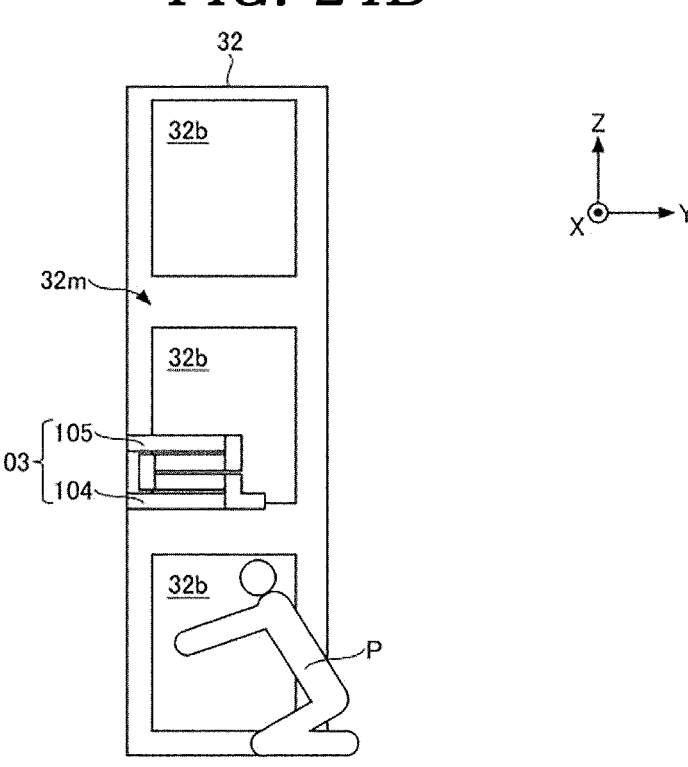

With reference to FIG. 24A and FIG. 24B, a method of performing the maintenance of the drying device 32b of the lower level will be described. FIG. 24A and FIG. 24B are diagrams showing the intermediate area 32m during the maintenance of the lower level. FIG. 24A and FIG. 24B are a plan view and a side view, respectively, showing a part of the processing block 32 including the intermediate area 32m.

As shown in FIG. 24A and FIG. 24B, during the maintenance of the lower level, a worker P opens the door 101 to allow the intermediate area 32m to communicate with the external space. Thus, the worker P can enter the intermediate area 32m. In the intermediate area 32m, the worker P can perform the maintenance of the drying device 32b of the lower level without using the workbench 103.

Figure 25A:
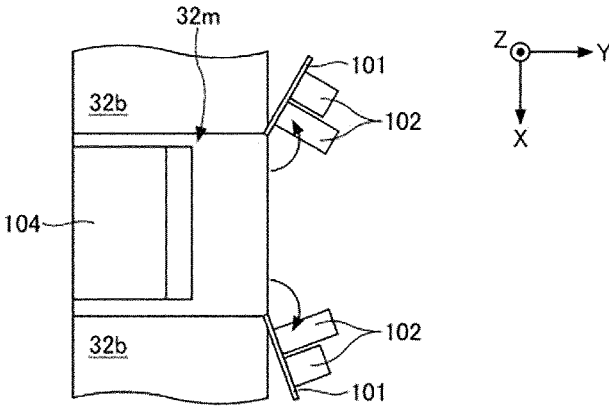
FIG. 25A and FIG. 25B are diagrams showing the intermediate area during maintenance of intermediate and upper levels.
Figure 25B:
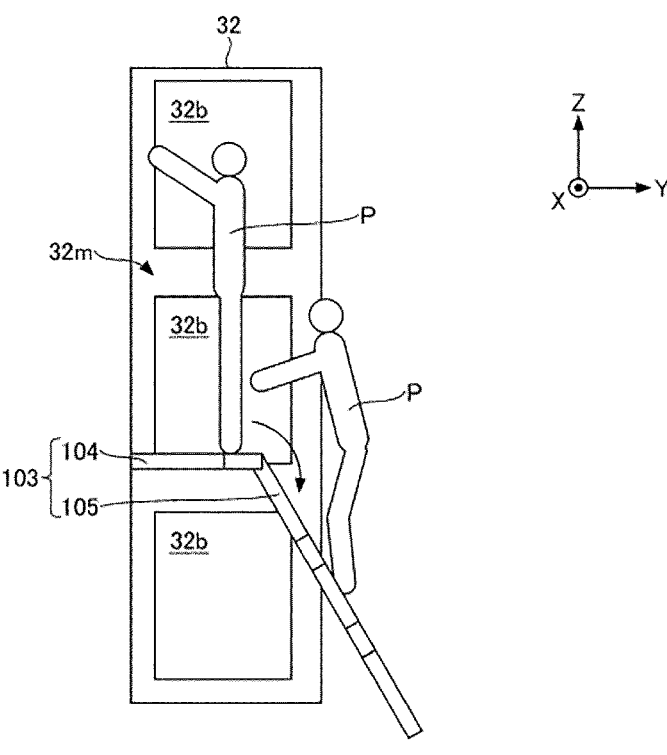

Referring to FIG. 25A and FIG. 25B, a method of performing the maintenance of the drying devices 32b of the intermediate level and the upper level will be described. FIG. 25A and FIG. 25B are diagrams showing the intermediate area 32m during the maintenance of the intermediate and upper levels. FIG. 25B and FIG. 25B are a plan view and a side view, respectively, showing a part of the processing block 32 including the intermediate area 32m.

As shown in FIG. 25A and FIG. 25B, during the maintenance of the intermediate and upper levels, the worker P first opens the door 101 to allow the intermediate area 32m to communicate with the external space. Then, the worker P unfolds the folded ladder 105. On the ladder 105 or the step stool 104, the worker P can perform the maintenance of the drying devices 32b of the intermediate and upper levels.

Modification Examples of Substrate Processing Apparatus

First Modification Example

Figure 26:
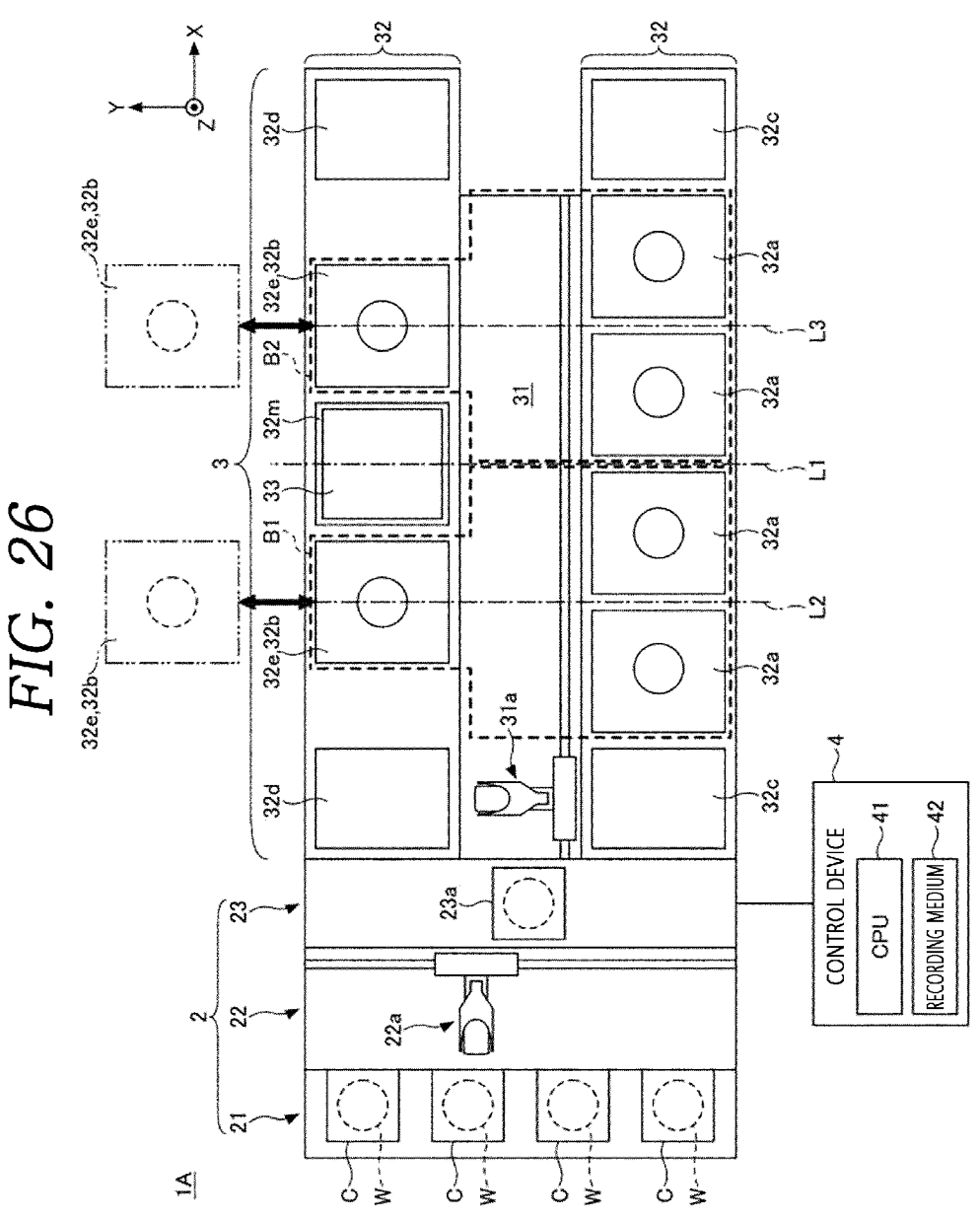
FIG. 26 is a plan view of a substrate processing apparatus according to a first modification example of the exemplary embodiment.

Referring to FIG. 26, a substrate processing apparatus 1A according to a first modification example of the exemplary embodiment will be described. FIG. 26 is a plan view of the substrate processing apparatus 1A according to the first modification example of the exemplary embodiment.

In the first modification example, as illustrated in FIG. 26, two drying devices 32b are provided on one side (positive Y-axis side) of the transfer block 31, and the intermediate area 32m is provided between the two drying devices 32b. The intermediate area 32m is not an area where a worker enters during the maintenance, and the electrical equipment block 33 can be provided in the entire intermediate area 32m. In this case, the overall height of the substrate processing apparatus 1A can be reduced. In the first modification example, the drying device 32b and the inspecting device 32e are configured to be movable in a direction (positive Y-axis direction) away from the transfer block 31. In this case, the worker P can repair or replace members near carry-in/out openings for the substrate W in the drying device 32b and the inspecting device 32e without needing to enter the intermediate area 32m. In addition, the drying device 32b and the inspecting device 32e are also movable in a direction (negative Y-axis direction) approaching the transfer block 31 as well.

Moreover, in the first modification example, only the drying device 32b may be configured to be movable in the positive and negative Y-axis directions.

Second Modification Example

Figure 27:
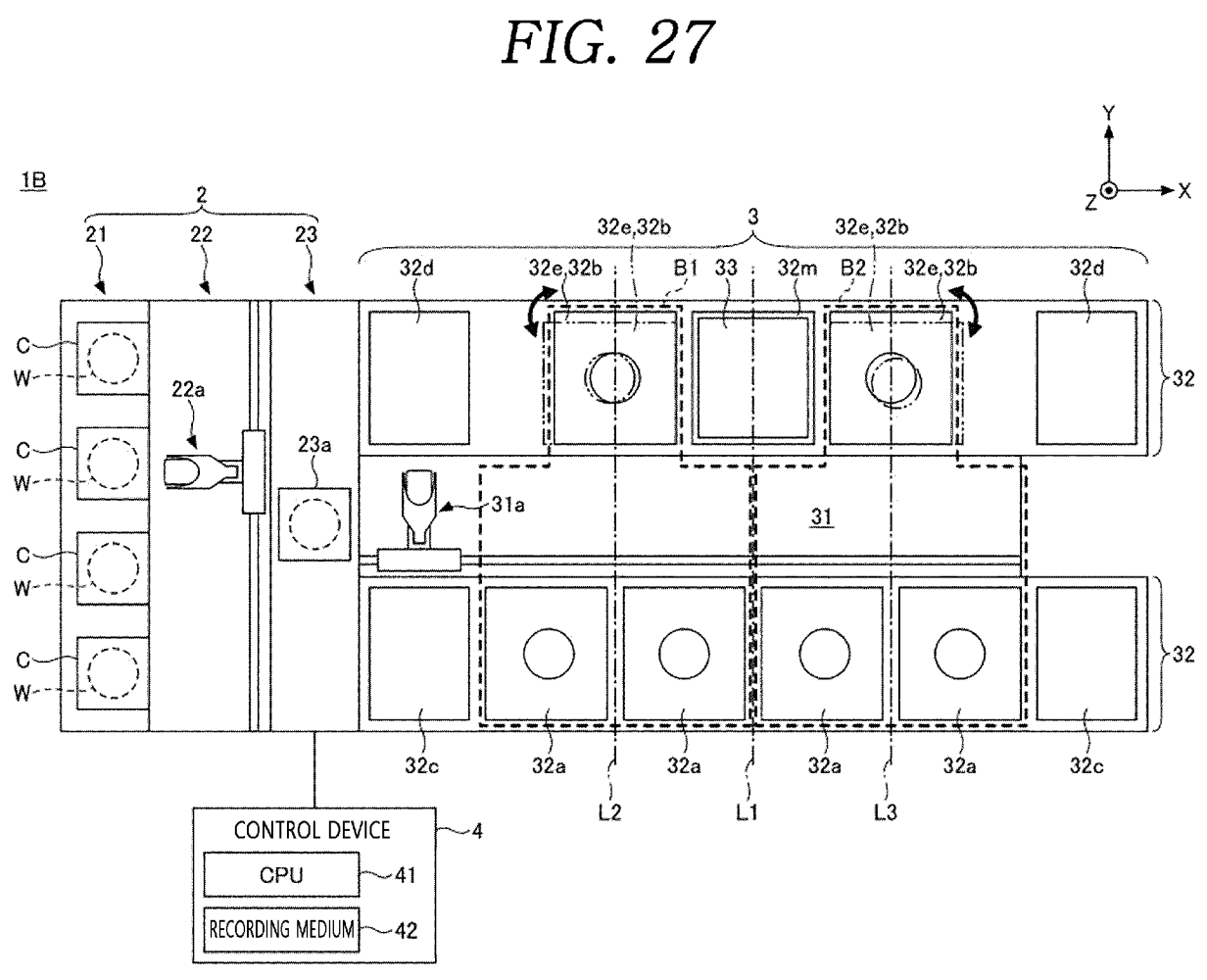

Referring to FIG. 27, a substrate processing apparatus 1B according to a second modification example of the exemplary embodiment will be described. FIG. 27 is a plan view of the substrate processing apparatus 1B according to the second modification example of the exemplary embodiment.

In the second modification example, as depicted in FIG. 27, two drying devices 32*b* are disposed on one side (positive Y-axis side) of the transfer block 31, and the intermediate area 32*m* is provided between the two drying devices 32*b*. The intermediate area 32*m* is not an area where a worker enters during the maintenance, and the electrical equipment block 33 can be provided in the entire intermediate area 32*m*. In this case, the overall height of the substrate processing apparatus 1B can be reduced. In the second modification example, the drying devices 32*b* and the inspecting devices 32*e* are configured to be rotatable horizontally. For example, the drying device 32*b* and the inspecting device 32*e* of the first unit block B1 may be configured to be rotated 90 degrees counterclockwise. For example, the drying device 32*b* and the inspecting device 32*e* of the second unit block B2 may be configured to be rotated 90 degrees clockwise. In this case, surfaces of the drying device 32*b* and the inspecting device 32*e* facing the intermediate area 32*m* is directed toward the positive Y-axis side. Thus, the worker P can repair or replace members near the carry-in/out openings for the substrate W in the drying device 32*b* and the inspecting device 32*e* without needing to enter the intermediate area 32*m*. Further, the drying device 32*b* and the inspecting device 32*e* may be configured to be rotated 90 degrees both clockwise and counterclockwise.

Alternatively, in the second modification example, only the drying device 32*b* may be configured to be rotatable horizontally.

Third Modification Example

Figure 28:
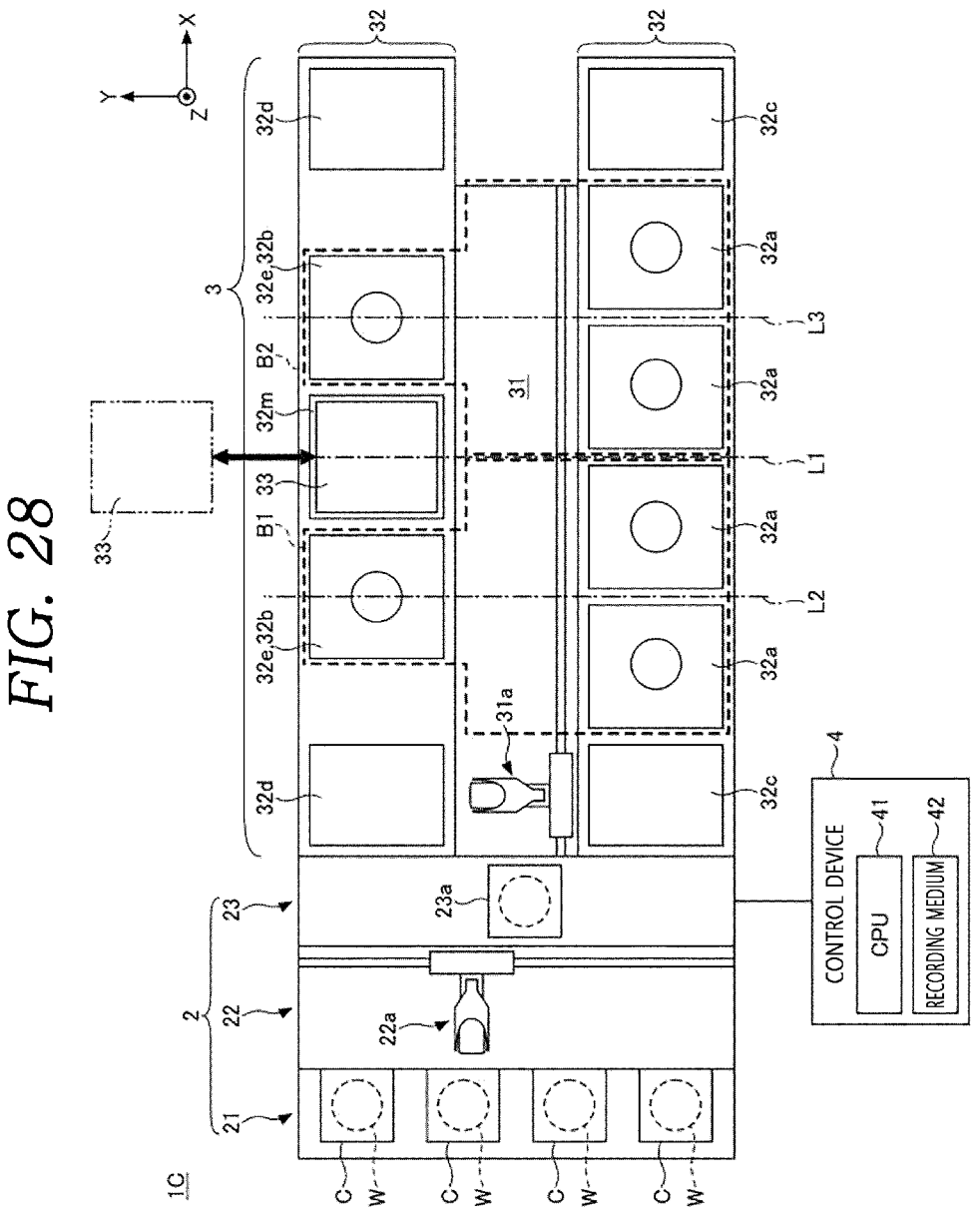
FIG. 28 is a plan view of a substrate processing apparatus according to a third modification example of the exemplary embodiment.

Referring to FIG. 28, a substrate processing apparatus 1C according to a third modification example of the exemplary embodiment will be described. FIG. 28 is a plan view of the substrate processing apparatus 1C according to the third modification example of the exemplary embodiment.

In the third modification example, the electrical equipment block 33 is provided in the intermediate area 32*m*, as illustrated in FIG. 28. In this case, the overall height of the substrate processing apparatus 1C can be reduced. In the third modification example, the electrical equipment block 33 is configured to be movable in a direction (positive Y-axis direction) away from the transfer block 31. In this case, when performing the maintenance of the drying device 32*b*, the worker P moves the electrical equipment block 33 in the positive Y-axis direction to the outside of the intermediate area 32*m*. Thus, the worker P can enter the intermediate area 32*m* and perform the maintenance of the drying device 32*b*. Further, the worker P does not have to completely move the electrical equipment block 33 to the outside of the intermediate area 32*m*. The position to which the electrical equipment block 33 is moved can be any position where the worker P can enter the intermediate area 32*m*, and it may be a position where a part of the electrical equipment block 33 may be left in the intermediate area 32*m*.

Fourth Modification Example

Figure 29:
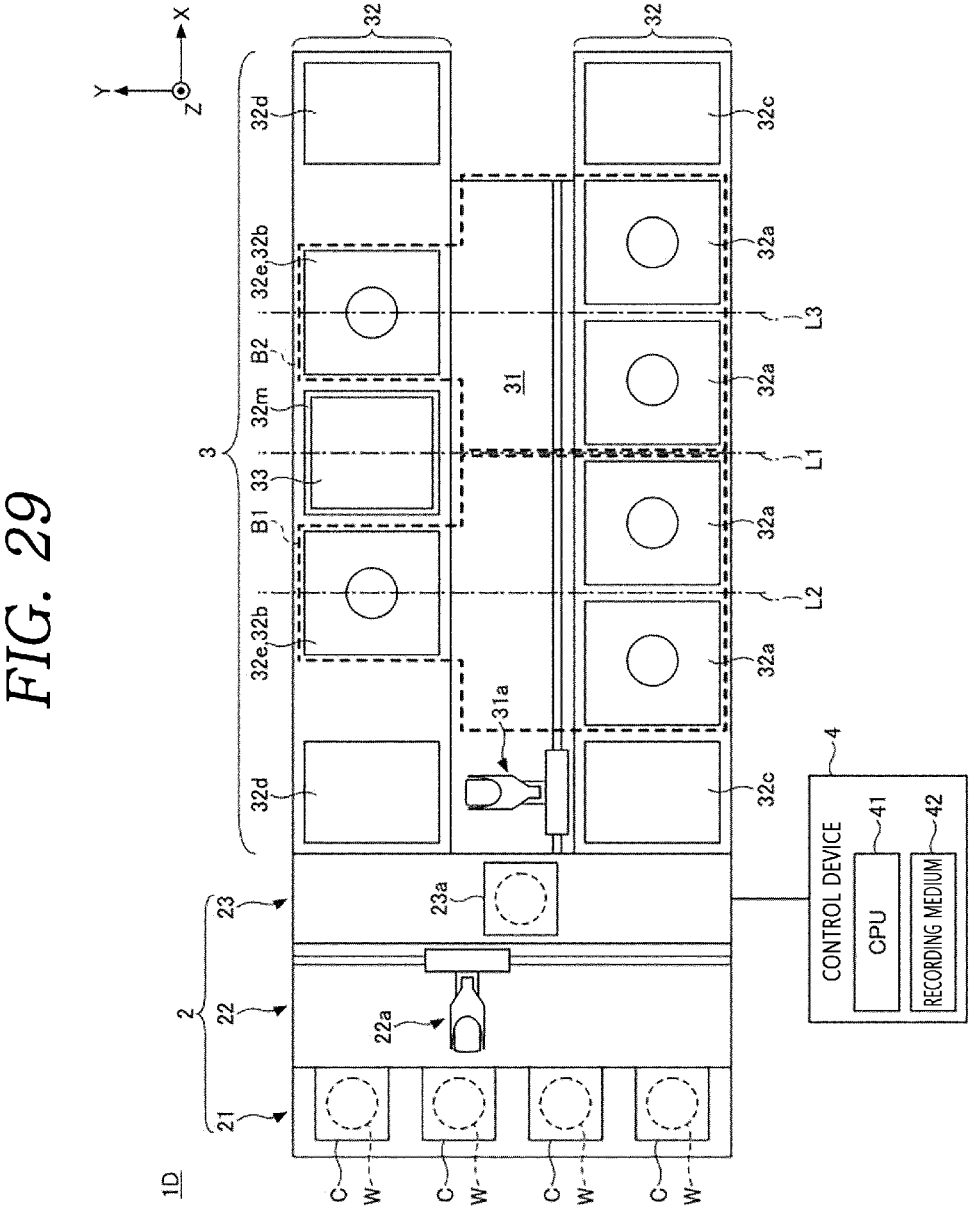
FIG. 29 is a plan view of a substrate processing apparatus according to a fourth modification example of the exemplary embodiment.
Figure 30:
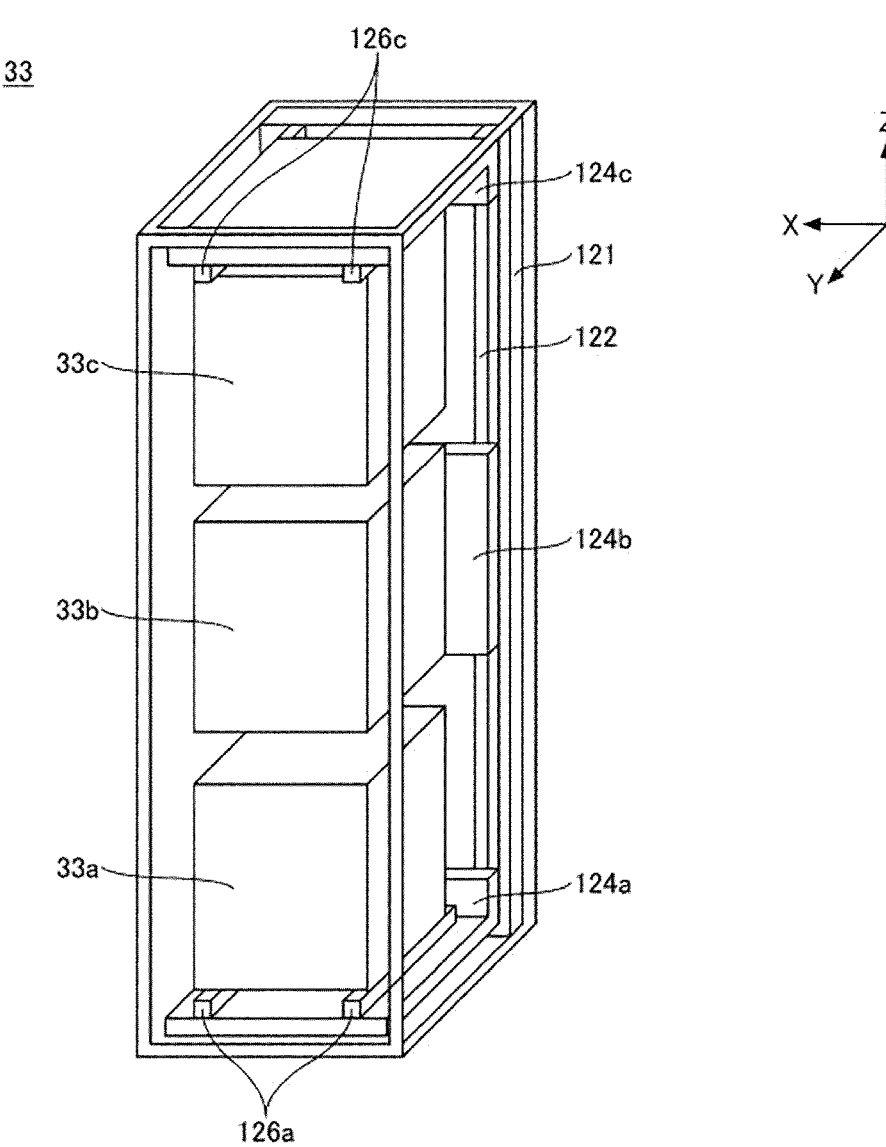
FIG. 30 is a perspective view illustrating an electrical equipment block.
Figure 31:
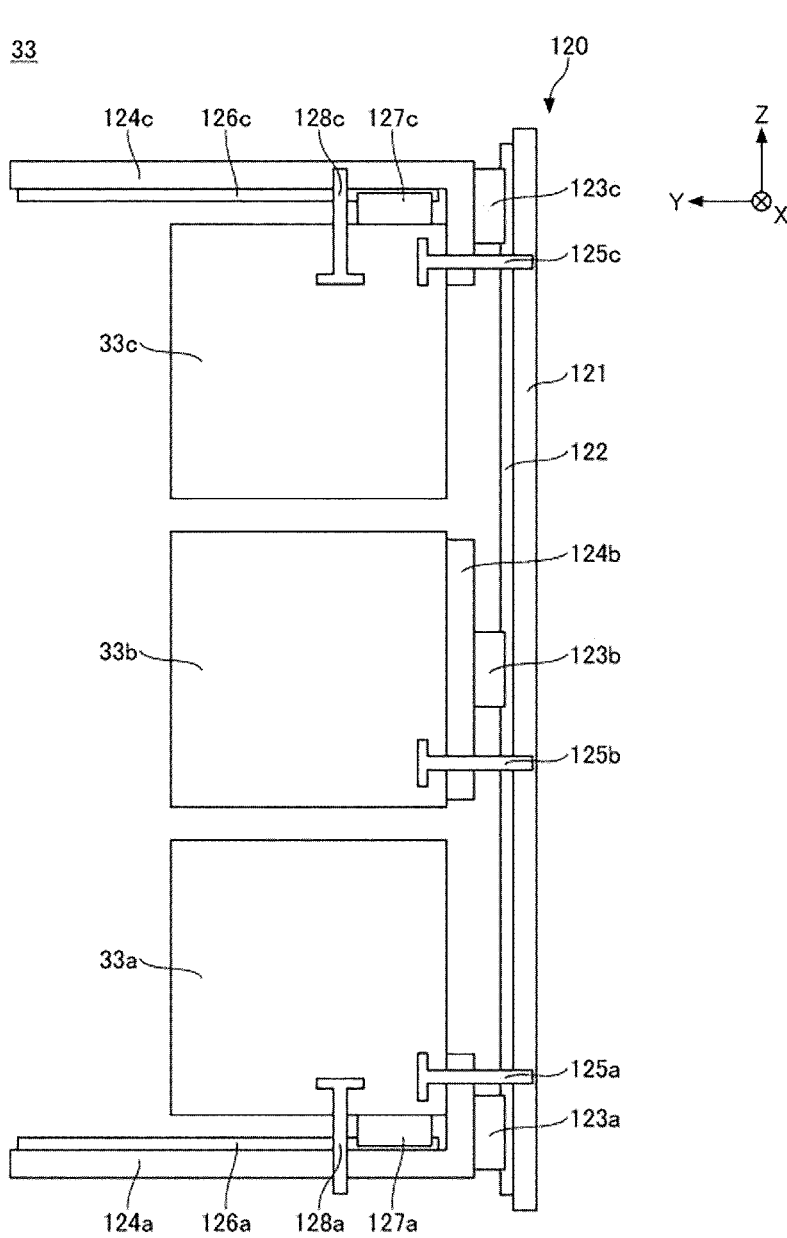
FIG. 31 is a side view illustrating the electrical equipment block.

Referring to FIG. 29 to FIG. 31, a substrate processing apparatus 1D according to a fourth modification example of the exemplary embodiment will be explained. FIG. 29 is a plan view of the substrate processing apparatus 1D according to the fourth modification example of the exemplary embodiment. FIG. 30 is a perspective view illustrating the electrical equipment block 33. FIG. 31 is a side view illustrating the electrical equipment block 33.

In the fourth modification example, the electrical equipment block 33 is provided in the intermediate area 32*m*, as shown in FIG. 29. In this case, the overall height of the substrate processing apparatus 1D can be reduced.

In the fourth modification example, as shown in FIG. 30 and FIG. 31, the electrical equipment block 33 has three electrical equipment boxes 33*a*, 33*b*, and 33*c* stacked in multiple levels in the vertical direction. The respective electrical equipment boxes 33*a*, 33*b*, and 33*c* are configured to be movable independently of each other. In this case, a maintenance space can be secured for each of the levels.

The electrical equipment block 33 has the three electrical equipment boxes 33*a*, 33*b* and 33*c*, and a holder 120.

The electrical equipment boxes 33*a*, 33*b*, and 33*c* are provided at a lower level, an intermediate level, and an upper level, respectively. Each of the electrical equipment boxes 33*a*, 33*b*, and 33*c* is provided with: an electronic control device group that controls the operation of the drying device 32*b* of the lower level, the intermediate level, or the upper level; and a housing that accommodates the electronic control device group.

The holder 120 has a first base 121, a vertical guide rail 122, vertically moving members 123*a*, 123*b* and 123*c*, second bases 124*a*, 124*b* and 124*c*, vertically moving locks 125*a*, 125*b* and 125*c*, horizontal guide rails 126*a* and 126*c*, horizontally moving members 127*a* and 127*c*, and horizontally moving locks 128*a* and 128*c*.

The first base 121 is disposed at an end of the intermediate area 32*m* on the negative Y-axis side. The first base 121 extends from a top to a bottom of the processing station 3 along the vertical direction.

The vertical guide rail 122 is fixed to the first base 121. The vertical guide rail 122 extends from a top to a bottom of the first base 121 along the vertical direction. The vertical guide rail 122 may be, for example, an LM (Linear Motion) rail.

Each of the vertically moving members 123*a*, 123*b*, and 123*c* is configured to be movable in the vertical direction along the vertical guide rail 122. The vertically moving members 123*a*, 123*b*, and 123*c* are arranged in this order from below. The vertically moving members 123*a*, 123*b*, and 123*c* may be, for example, LM blocks.

The second base 124*a* has a vertical portion fixed to the vertically moving member 123*a*, and a horizontal portion that is bent into an L-shape at a lower end of the vertical portion to extend in the positive Y-axis direction. The second base 124*b* has a vertical portion fixed to the vertically moving member 123*a*. The electrical equipment box 33*b* is fixed to the second base 124*b*. The second base 124*c* has a vertical portion fixed to the vertically moving member 123*c*, and a horizontal portion that is bent into an L-shape at an upper end of the vertical portion to extend in the positive Y-axis direction.

The vertically moving locks 125*a*, 125*b*, and 125*c* are configured to lock movements of the second bases 124*a*, 124*b*, and 124*c* relative to the first base 121 along the vertical direction, respectively.

The horizontal guide rails 126*a* and 126*c* are fixed to the horizontal portions of the second bases 124*a* and 124*c*, respectively. The horizontal guide rails 126*a* and 126*c* extend along the Y-axis direction. The horizontal guide rails 126*a* and 126*c* may be, by way of example, LM rails.

The horizontally moving members 127*a* and 127*c* are configured to be movable in the Y-axis direction along the horizontal guide rails 126*a* and 126*c*, respectively. The electrical equipment boxes 33*a* and 33*c* are fixed to the horizontally moving members 127*a* and 127*c*, respectively.

The horizontally moving members 127*a* and 127*c* may be, by way of non-limiting example, LM blocks.

The horizontally moving locks 128*a* and 128*c* are configured to lock movements of the electrical equipment boxes 33*a* and 33*c* relative to the second bases 124*a* and 124*c* along the Y-axis direction, respectively.

In this holder 120, the electrical equipment box 33*a* is elevated up and down by moving the vertically moving member 123*a* along the vertical guide rail 122, and is moved horizontally along the Y-axis direction by moving the horizontally moving member 127*a* along the horizontal guide rail 126*a*. The electrical equipment box 33*b* is elevated up and down by moving the vertically moving member 123*b* along the vertical guide rail 122. The electrical equipment box 33*c* is elevated up and down by moving the vertically moving member 123*c* along the vertical guide rail 122, and is moved horizontally along the Y-axis direction by moving the horizontally moving member 127*c* along the horizontal guide rail 126*c*.

Figures 32A, 32B, 32C:
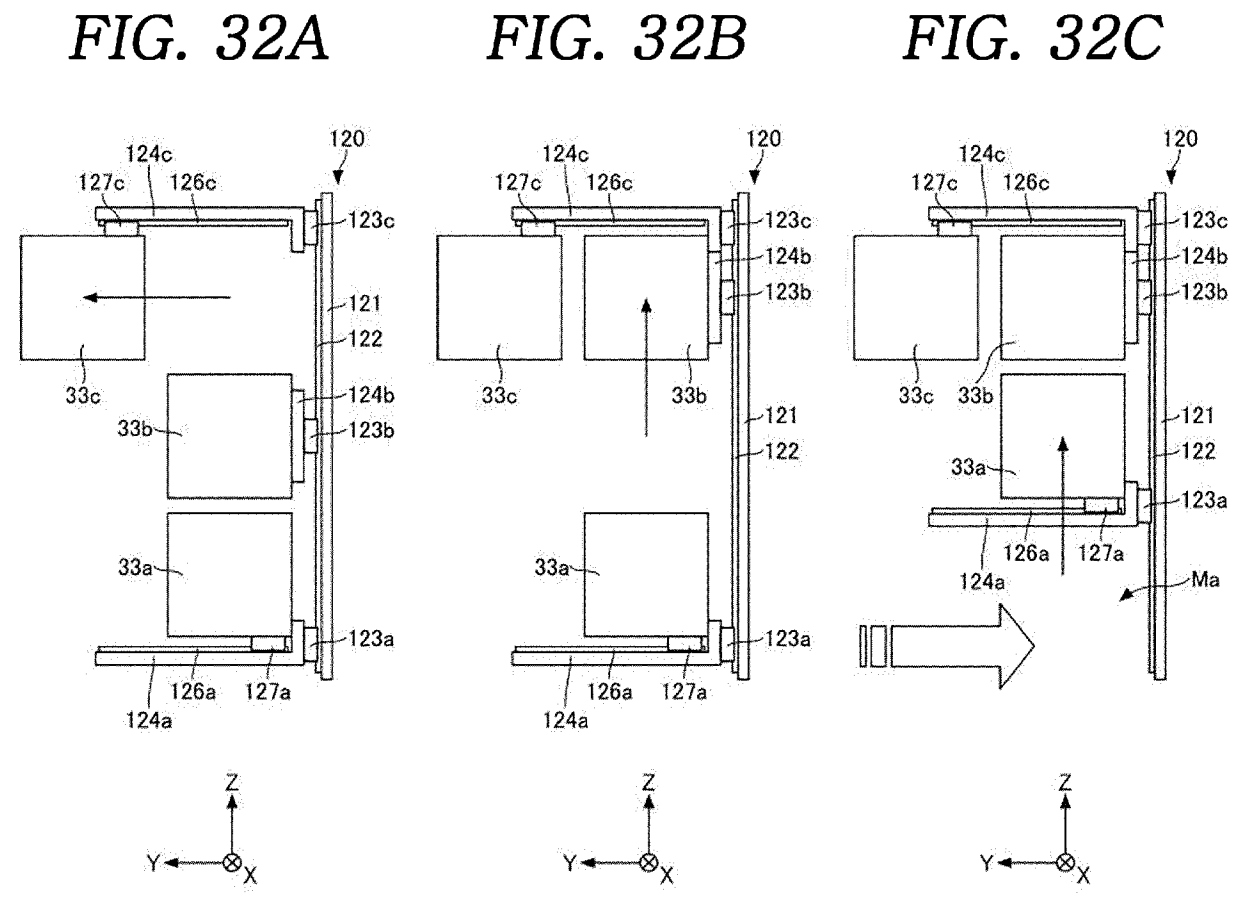

Referring to FIG. 32A to FIG. 32C, a method of performing the maintenance of the drying device 32*b* of the lower level will be described. FIG. 32A to FIG. 32C are side views illustrating movements of the electrical equipment block 33 during the maintenance of the lower level.

First, as shown in FIG. 32A, the worker P takes out the electrical equipment box 33*c* from the intermediate area 32*m*. Specifically, the worker P releases the fixation of the electrical equipment box 33*c* by the horizontally moving lock 128*c*, and moves the horizontally moving member 127*c* in the positive Y-axis direction along the horizontal guide rail 126*c*.

Then, as shown in FIG. 32B, the worker P raises the electrical equipment box 33*b* to the same height position as the drying device 32*b* of the upper level. Specifically, the worker P releases the fixation of the electrical equipment box 33*b* by the vertically moving lock 125*b*, and moves the vertically moving member 123*b* in the positive Z-axis direction along the vertical guide rail 122.

Thereafter, as illustrated in FIG. 32C, the worker P raises the electrical equipment box 33*a* to the same height position as the drying device 32*b* of the intermediate level. Specifically, the worker P releases the fixation of the electrical equipment box 33*a* by the vertically moving lock 125*a*, and moves the vertically moving member 123*a* in the positive Z-axis direction along the vertical guide rail 122.

Through the above-described operations, in the intermediate area 32*m*, a lower maintenance space Ma is formed at the same height position as the drying device 32*b* of the lower level. Thus, the worker P can enter the lower maintenance space Ma and perform the maintenance of the drying device 32*b* of the lower level.

Referring to FIG. 33A and FIG. 33B, a method of performing the maintenance of the drying device 32*b* of the intermediate level will be described. FIG. 33A and FIG. 33B are side views illustrating movements of the electrical equipment block 33 during the maintenance of the intermediate level.

First, as shown in FIG. 33A, the worker P takes out the electrical equipment box 33*c* from the intermediate area 32*m*. Specifically, the worker P releases the fixation of the electrical equipment box 33*c* by the horizontally moving lock 128*c*, and moves the horizontally moving member 127*c* in the positive Y-axis direction along the horizontal guide rail 126*c*.

Subsequently, as illustrated in FIG. 33B, the worker P raises the electrical equipment box 33*b* to the same height position as the drying device 32*b* of the upper level. Specifically, the worker P releases the fixation of the electrical equipment box 33*b* by the vertically moving lock 125*b*, and moves the vertically moving member 123*b* in the positive Z-axis direction along the vertical guide rail 122.

Through the above-described operations, in the intermediate area 32*m*, an intermediate maintenance space Mb is formed at the same height position as the drying device 32*b* of the intermediate level. Thus, the worker P can enter the intermediate maintenance space Mb and perform the maintenance of the drying device 32*b* of the intermediate level.

Figures 34A, 34B, 34C:
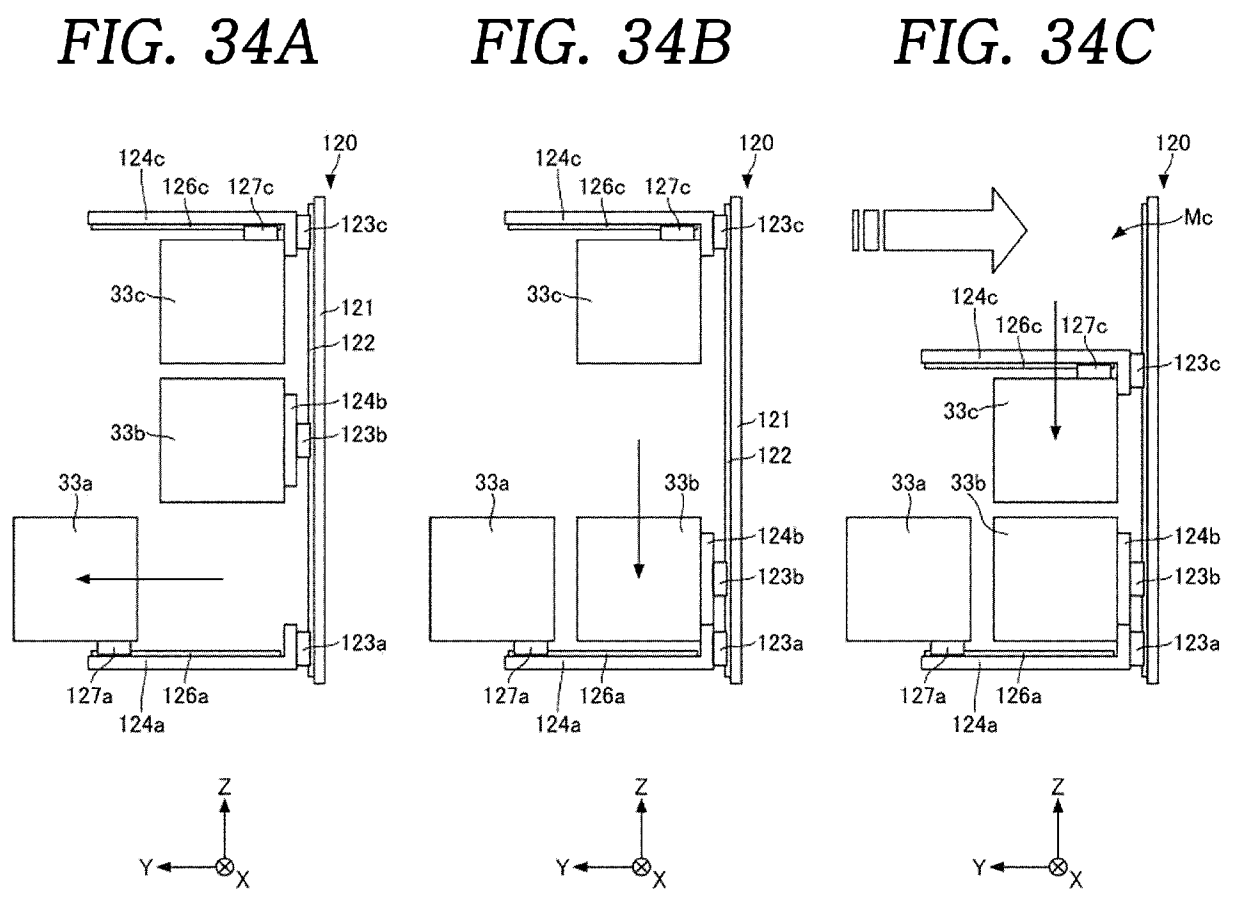

Referring to FIG. 34A to FIG. 34C, a method of performing the maintenance of the drying device 32*b* of the upper level will be described. FIG. 34A to FIG. 34C are side views illustrating movements of the electrical equipment block 33 during the maintenance of the upper level.

First, as shown in FIG. 34A, the worker P takes out the electrical equipment box 33*a* from the intermediate area 32*m*. Specifically, the worker P releases the fixation of the electrical equipment box 33*a* by the horizontally moving lock 128*a*, and moves the horizontally moving member 127*a* in the positive Y-axis direction along the horizontal guide rail 126*a*.

Then, as shown in FIG. 34B, the worker P lowers the electrical equipment box 33*b* to the same height position as the drying device 32*b* of the lower level. Specifically, the worker P releases the fixation of the electrical equipment box 33*b* by the vertically moving lock 125*b*, and moves the vertically moving member 123*b* in the negative Z-axis direction along the vertical guide rail 122.

Subsequently, as shown in FIG. 34C, the worker P lowers the electrical equipment box 33*c* to the same height as the drying device 32*b* of the intermediate level. Specifically, the worker P releases the fixation of the electrical equipment box 33*c* by the vertically moving lock 125*c* and moves the vertically moving member 123*c* to the negative side in the Z-axis direction along the vertical guide rail 122.

Through the above-described operations, in the intermediate area 32*m*, an upper maintenance space Mc is formed at the same height position as the drying device 32*b* of the upper level. Thus, the worker P can enter the upper maintenance space Mc and perform the maintenance of the drying device 32*b* of the upper level.

It should be noted that the above-described exemplary embodiment is illustrative in all aspects and is not anyway limiting. The above-described exemplary embodiment may be omitted, replaced and modified in various ways without departing from the scope and the spirit of claims.

The above exemplary embodiment has been descried for the case where the length of the transfer path of the substrate W is equal between the drying device 32*b* and each of the plurality of liquid film forming devices 32*a* included in the same unit block. However, the present disclosure is not limited thereto. For example, the second transfer device 31*a* may be configured to transfer the substrates W so that a transfer time of the substrates W is the same between the drying device 32*b* and each of the plurality of liquid film forming devices 32*a* belonging to the same unit block. In this case as well, the time taken until the liquid film formed on the top surface of the substrate W in each of the two liquid film forming devices 32*a* is replaced with the supercritical fluid in the drying device 32*b* can be made equal. As a result, the non-uniformity in the processing quality of the substrates W processed in the respective liquid film forming devices 32*a* can be reduced. The transfer time of the substrate W may be adjusted by, for example, controlling a moving speed of the second transfer device 31*a*. The transfer time of the substrate W may be adjusted by, for example, controlling a time period during which the substrate W stands by in the liquid film forming device 32a or a time period during which the second transfer device 31a is stopped in the state it is holding the substrate W after the liquid film is formed on the top surface of the substrate W.

According to the exemplary embodiments, it is possible to reduce the non-uniformity in processing between the substrates.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a unit block including multiple liquid film forming devices each configured to form a liquid film on a top surface of a substrate, and a drying device configured to replace the liquid film with a supercritical fluid to dry the substrate; and
a transfer block provided between the multiple liquid film forming devices and the drying device,
wherein the transfer block includes a transfer device configured to transfer the substrate between the multiple liquid film forming devices and the drying device,
a length of a transfer path of the substrate is equal between each of the multiple liquid film forming devices and the drying device, and
the multiple liquid film forming devices are disposed, without any intervening block, adjacent to each other along a lengthwise direction of the transfer block,
wherein the unit block includes multiple unit blocks, and the multiple unit blocks are arranged along the lengthwise direction of the transfer block of a rectangular shape,
wherein the multiple unit blocks include a first unit block having a first drying device and a second unit block having a second drying device,
when viewed from a top, the first drying device and the second drying device are disposed on one side of the transfer block, and an intermediate area is provided between the first drying device and the second drying device, and
the substrate processing apparatus further comprises an electrical equipment block including a device configured to control the first drying device and the second drying device.

2. The substrate processing apparatus of claim 1, wherein the multiple liquid film forming devices include a first liquid film forming device and a second liquid film forming device, and
when viewed from a top, the first liquid film forming device and the second liquid film forming device are arranged to be axisymmetric about an imaginary line passing through a center of the drying device.

3. The substrate processing apparatus of claim 1, wherein a maintenance area is provided between the first drying device and the second drying device to perform maintenance of the first drying device and the second drying device.

4. The substrate processing apparatus of claim 2, further comprising:
a workbench provided in the maintenance area to be used during the maintenance.

5. The substrate processing apparatus of claim 1,
wherein the first drying device and the second drying device are configured to be moved in a direction away from the transfer block.

6. The substrate processing apparatus of claim 1,
wherein the first drying device and the second drying device are configured to be rotated horizontally.

7. The substrate processing apparatus of claim 1,
wherein the electrical equipment block is configured to be moved in a direction away from the transfer block.

8. The substrate processing apparatus of claim 1,
wherein the first unit block includes multiple first unit blocks, and the second unit block includes multiple second unit blocks, and
the multiple first unit blocks are stacked in multiple levels in a vertical direction and the multiple second unit blocks are stacked in multiple levels in the vertical direction.

9. The substrate processing apparatus of claim 8,
wherein the transfer block includes multiple transfer blocks, and
the multiple transfer blocks are stacked in multiple levels in the vertical direction.

10. The substrate processing apparatus of claim 9,
wherein the electrical equipment block includes multiple electrical equipment boxes stacked in multiple levels in the vertical direction, and
the electrical equipment boxes are configured to be moved independently of each other.

11. A substrate processing method performed in a substrate processing apparatus including a unit block having multiple liquid film forming devices each configured to form a liquid film on a top surface of a substrate and a drying device configured to replace the liquid film with a supercritical fluid to dry the substrate, and a transfer block provided between the multiple liquid film forming devices and the drying device,
wherein the transfer block includes a transfer device configured to transfer the substrate between the multiple liquid film forming devices and the drying device,
a length of a transfer path of the substrate is equal between each of the multiple liquid film forming devices and the drying device, and
wherein the substrate processing method comprises:
forming, by the liquid film forming device, the liquid film on the top surface of the substrate;
transferring, by the transfer device, the substrate having the liquid film formed thereon from the liquid film forming device to the drying device; and
drying, by the drying device, the substrate by replacing the liquid film with the supercritical fluid,
wherein the multiple liquid film forming devices are disposed, without any intervening block, adjacent to each other along a lengthwise direction of the transfer block,
wherein the unit block includes multiple unit blocks, and the multiple unit blocks are arranged along the lengthwise direction of the transfer block of a rectangular shape, wherein the multiple unit blocks include a first unit block having a first drying device and a second unit block having a second drying device, when viewed from a top, the first drying device and the second drying device are disposed on one side of the transfer block, and an intermediate area is provided between the first drying device and the second drying device, and the substrate processing apparatus further comprises an electrical equipment block including a device configured to control the first drying device and the second drying device.

12. A substrate processing apparatus, comprising:

a unit block including multiple liquid film forming devices each configured to form a liquid film on a top surface of a substrate, and a drying device configured to replace the liquid film with a supercritical fluid to dry the substrate; and a transfer block provided between the multiple liquid film forming devices and the drying device, wherein the transfer block includes a transfer device configured to transfer the substrate between the multiple liquid film forming devices and the drying device, the transfer device transfers the substrate such that a transfer time of the substrate becomes equal between each of the multiple liquid film forming devices and the drying device, and the multiple liquid film forming devices are disposed, without any intervening block, adjacent to each other along a lengthwise direction of the transfer block, wherein the unit block includes multiple unit blocks, and the multiple unit blocks are arranged along the lengthwise direction of the transfer block of a rectangular shape, wherein the multiple unit blocks include a first unit block having a first drying device and a second unit block having a second drying device, when viewed from a top, the first drying device and the second drying device are disposed on one side of the transfer block, and an intermediate area is provided between the first drying device and the second drying device, and the substrate processing apparatus further comprises an electrical equipment block including a device configured to control the first drying device and the second drying device.

* * * * *